(12) United States Patent
Tsukahara et al.

(10) Patent No.: US 7,090,482 B2
(45) Date of Patent: Aug. 15, 2006

(54) SEMICONDUCTOR DEVICE PACKAGE MANUFACTURING METHOD AND SEMICONDUCTOR DEVICE PACKAGE MANUFACTURED BY THE METHOD

(75) Inventors: Norihito Tsukahara, Kyoto (JP); Takashi Akiguchi, Osaka (JP); Hidenori Miyakawa, Moriguchi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 30 days.

(21) Appl. No.: 10/736,568

(22) Filed: Dec. 17, 2003

(65) Prior Publication Data

US 2004/0130024 A1 Jul. 8, 2004

Related U.S. Application Data

(63) Continuation of application No. 10/031,000, filed as application No. PCT/JP00/04699 on Jul. 13, 2000.

(30) Foreign Application Priority Data

Jul. 16, 1999 (JP) .................................. 11-202847
Mar. 8, 2000 (JP) ................................. 2000-63686

(51) Int. Cl.
*B29C 33/00* (2006.01)

(52) U.S. Cl. .............................. 425/149; 257/E23.066; 257/E23.12; 257/E23.107

(58) Field of Classification Search ................ 257/737, 257/E23.123, E23.116, E23.107, E23.066, 257/E23.023, E23.021, E23.012, E23.01; 425/149

See application file for complete search history.

(56) References Cited

U.S. PATENT DOCUMENTS

| | | | | |
|---|---|---|---|---|
| 4,625,102 A | 11/1986 | Rebjock et al. | ............. | 235/492 |
| 5,705,852 A | 1/1998 | Orihara et al. | ............. | 257/679 |
| 6,181,010 B1 | 1/2001 | Nozawa | ...................... | 257/737 |
| 6,181,569 B1* | 1/2001 | Chakravorty | ............... | 361/761 |
| 6,276,599 B1* | 8/2001 | Ogawa | ........................ | 228/254 |
| 6,412,701 B1 | 7/2002 | Kohama et al. | ............ | 235/488 |
| 2002/0048847 A1* | 4/2002 | Tsunoi et al. | ............... | 438/108 |
| 2002/0159242 A1 | 10/2002 | Nakatani et al. | ............ | 361/760 |
| 2006/0076692 A1* | 4/2006 | Lee et al. | .................... | 257/778 |

FOREIGN PATENT DOCUMENTS

| | | |
|---|---|---|
| EP | 0 387 066 A1 | 9/1990 |
| EP | 0 954 208 A1 | 11/1999 |
| JP | 6-163551 | 6/1994 |
| JP | 9-64078 | 3/1997 |
| JP | 9-97816 | 4/1997 |
| JP | 9-172021 | 6/1997 |
| JP | 10-112479 | 4/1998 |
| JP | 10-270497 | 10/1998 |
| JP | 2000-227952 | 8/2000 |
| JP | 2000-315249 | 11/2000 |
| JP | 2001-93934 | 4/2001 |
| WO | 98/30073 | 7/1998 |

* cited by examiner

*Primary Examiner*—Caridad M. Everhart
(74) *Attorney, Agent, or Firm*—Wenderoth, Lind & Ponack, L.L.P.

(57) ABSTRACT

A bump is formed on each element electrode of a semiconductor device, and a thermoplastic resin sheet is aligned in position with the semiconductor device. The sheet and the semiconductor device are subjected to hot pressing to melt the sheet, forming a thermoplastic resin portion that covers a portion other than the end surface of each bump of the semiconductor device. The thermoplastic resin portion obtained after the hot pressing is cut.

11 Claims, 35 Drawing Sheets

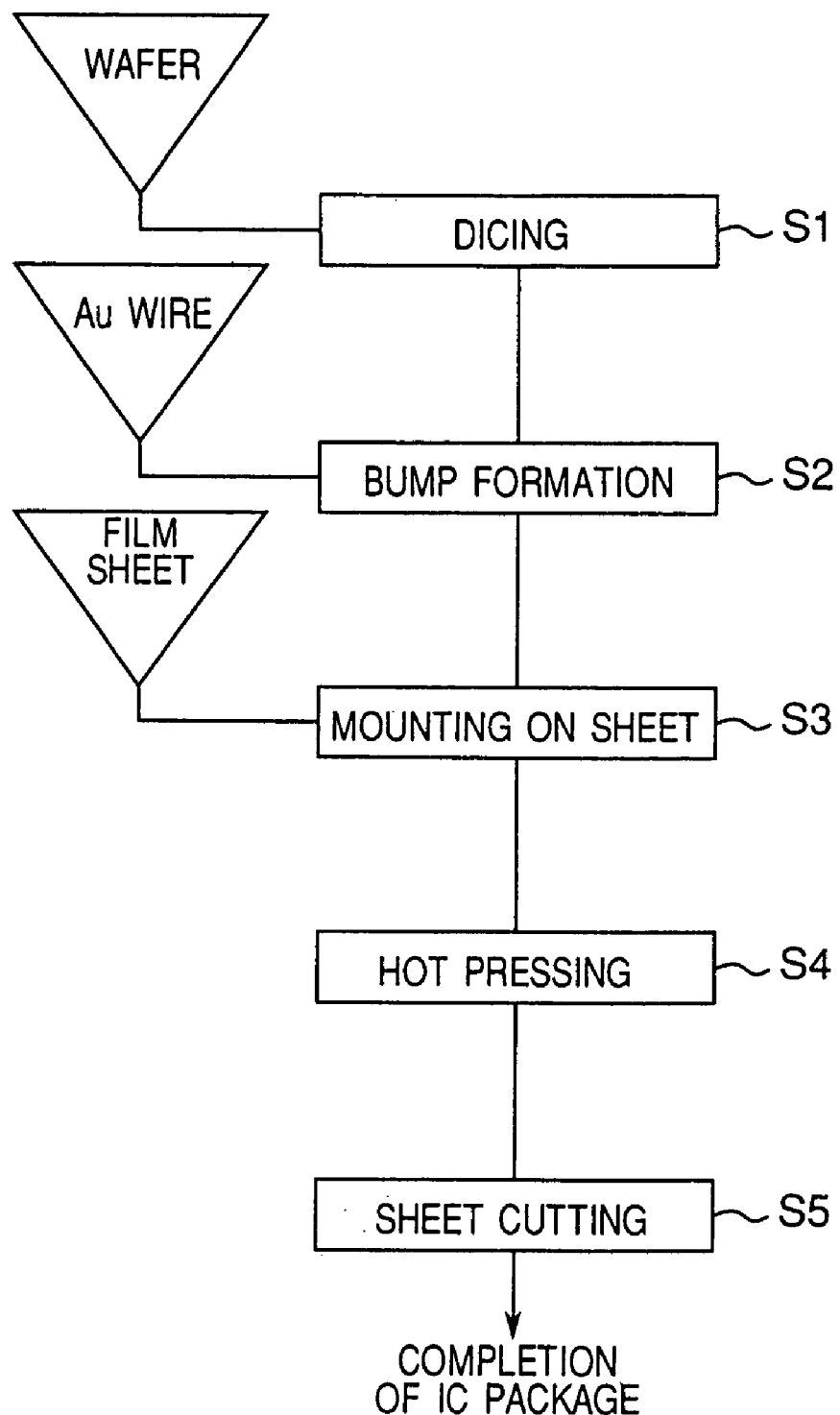

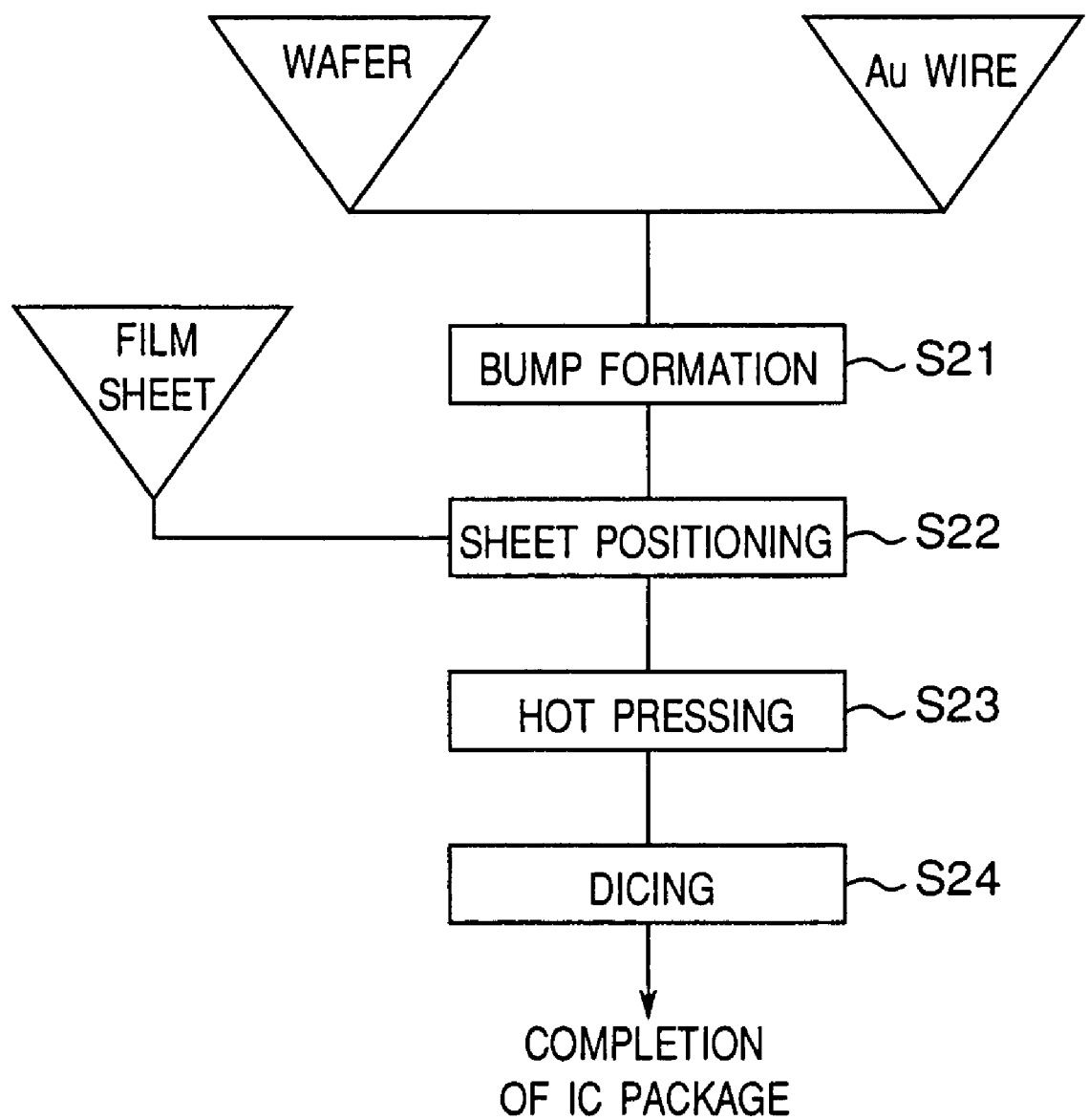

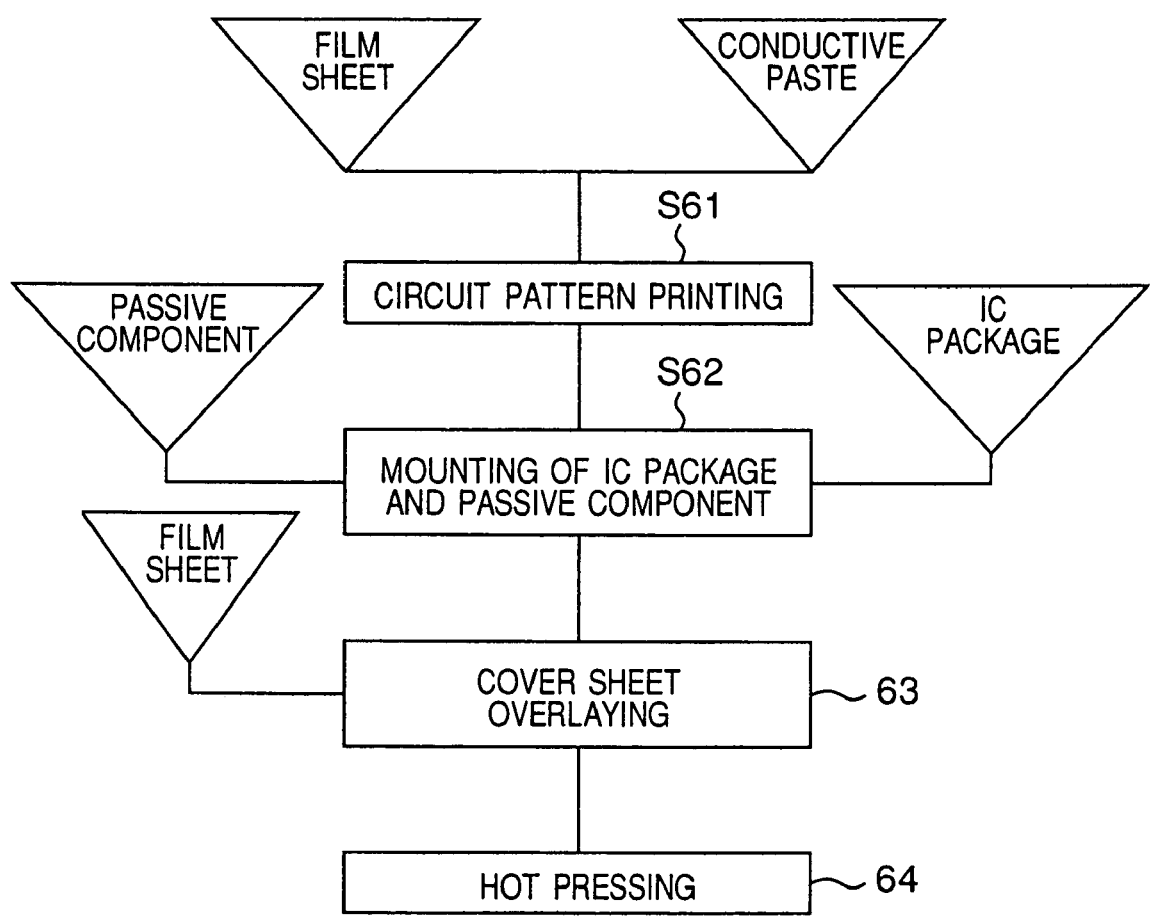

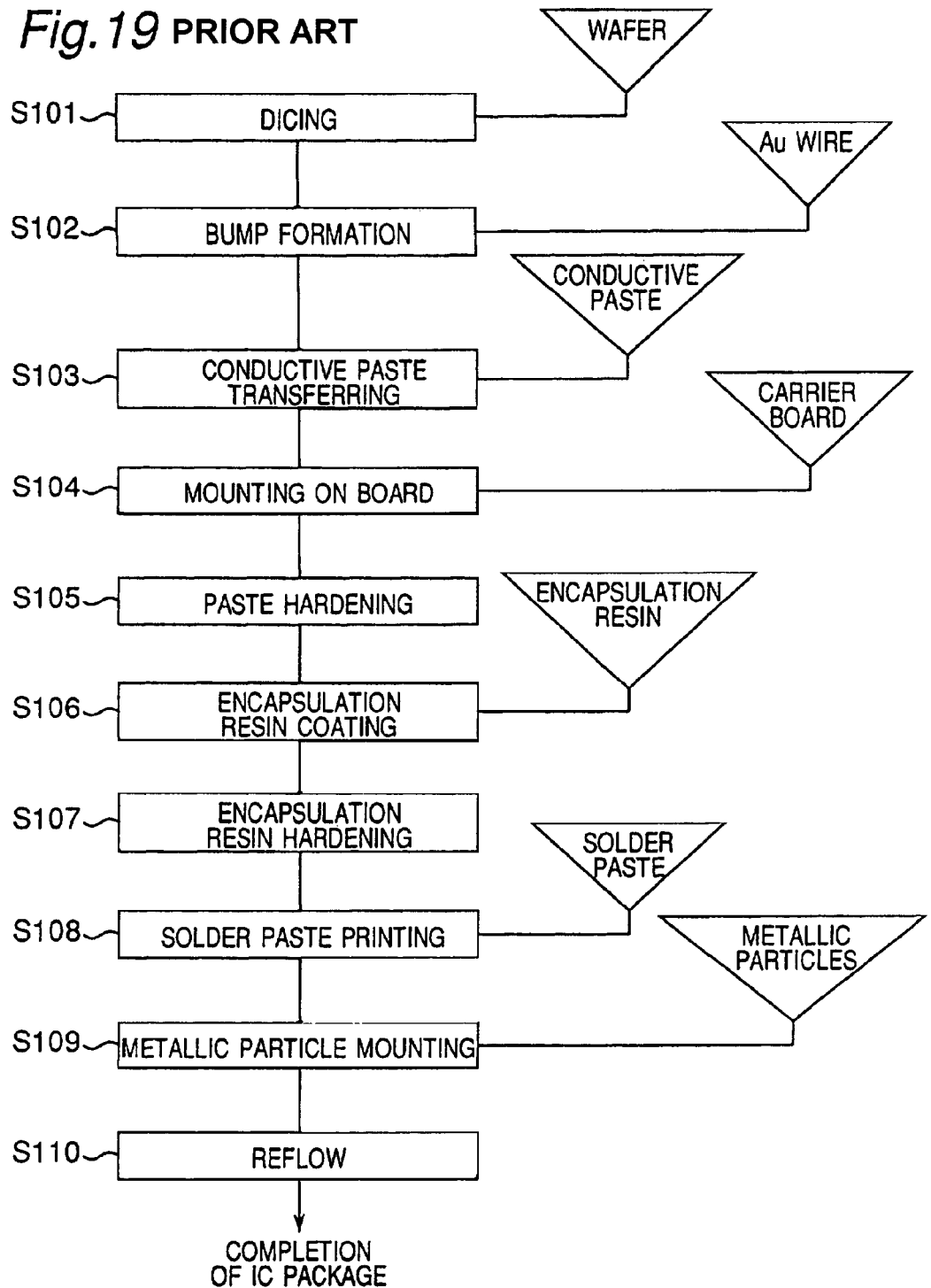

SEMICONDUCTOR DEVICE PACKAGE MANUFACTURING METHOD AND SEMICONDUCTOR DEVICE PACKAGE MANUFACTURED BY THE METHOD

This is a Continuation Application of US. application Ser. No. 10/031,000, filed Jan. 16, 2002, now U.S. Pat. No. 6,780,668 which is the National Stage of International Application No. PCT/JP00/04699, Jul. 13, 2000.

BACKGROUND OF THE INVENTION

1. Technical Field

The present invention relates to a semiconductor device package manufacturing method capable of mounting a semiconductor device with high density, a small thickness, high productivity, and high reliability, an electronic component module manufacturing method, a noncontact IC card manufacturing method, utilizing the method, a semiconductor device package manufactured by the semiconductor device package manufacturing method, a method for manufacturing a semiconductor device-mounted component such as a semiconductor device package and an electronic component module, a method for manufacturing a semiconductor device-mounted finished-product utilizing the semiconductor device-mounted component manufacturing method and a semiconductor device-mounted finished-product manufactured by the semiconductor device-mounted finished-product manufacturing method.

2. Description of Related Art

The conventional semiconductor device package will be described with reference to FIG. 18 through FIG. 21.

FIG. 20A, FIG. 20B, FIG. 20C, FIG. 20D and FIG. 21 show the manufacturing method process by process. FIG. 19 shows a process chart.

First of all, in step S101 of FIG. 19, dicing of a wafer is performed, and thereafter, a bump 104 is formed by the wire bonding method on each element electrode 105 of a semiconductor device 103 in step S102 as shown in FIG. 20A. The reference numeral 106 denotes a passivation film for protecting the active surface of the semiconductor device 103.

Next, in step S103, as shown in FIG. 20B, a conductive adhesive 116 is formed on the bump 104 by a transfer method. For the conductive adhesive 116, an epoxy-based adhesive, which include particles of Ag, Cu, or the like as a filler, is principally employed.

Next, in step S104, as shown in FIG. 20C, the semiconductor device 103 is mounted so that the bumps 104 of the semiconductor device 103 are electrically connected to the electrodes 117 of a circuit board 115 formed of ceramic, glass epoxy, or the like, and the conductive adhesive 116 is thermally hardened in step S105. The standard hardening conditions of the conductive adhesive 116 are 140° C. for 20 minutes.

Next, in step S106, as shown in FIG. 20D, a space between the semiconductor device 103 and the circuit board 115 is filled with an encapsulant 121 for securing reliability by a dispenser 122, and thermosetting is performed in step S107. The average conditions of the thermosetting are 140° C. for four hours.

Next, in step S108, as shown in FIG. 21, a solder paste 120 is printed on electrodes 118 formed on the side that belongs to the circuit board 115 and are opposite from the mounting surface of the semiconductor device 103, and thereafter, metallic particles 119 of Au, Cu, Ag, or the like are mounted in step S109 and made to pass through a reflow furnace in step S110, obtaining a semiconductor device package as shown in FIG. 18.

The semiconductor device package shown in FIG. 18 is thus completed through the processes of step S101 to step S110.

However, according to the above-mentioned conventional semiconductor device package manufacturing method and structure, there has been the issue that the productivity is low because many processes are needed and much time is necessary for the hardening of the conductive adhesive 116 and the encapsulant 121. Moreover, the circuit board 115 has a thickness of about 0.5 mm, and a total thickness of the semiconductor package becomes about 1 mm including the thickness of the semiconductor device 103. This structure has had difficulties in being reduced in thickness and the issue that the package cannot be applied to a commodity, which is restricted to a thickness of not greater than 0.76 mm as in, for example, a noncontact IC card.

Accordingly, the object of the present invention is to solve the aforementioned issues and provide a thin type semiconductor device package manufacturing method with high quality and high productivity, an electronic component module manufacturing method, a noncontact IC card manufacturing method, utilizing the semiconductor device package manufacturing method, a semiconductor device package manufactured by the semiconductor device package manufacturing method, a method for manufacturing a semiconductor device-mounted component such as a semiconductor device package and an electronic component module, a method for manufacturing a semiconductor device-mounted finished-product utilizing the semiconductor device-mounted component manufacturing method and a semiconductor device-mounted finished-product manufactured by the semiconductor device-mounted finished-product manufacturing method.

SUMMARY OF THE INVENTION

In order to achieve the aforementioned object, the present invention is constructed as follows.

According to a first aspect of the present invention, there is provided a semiconductor device package manufacturing method comprising:

forming bumps on element electrodes of a semiconductor device by a wire bonding method;

positioning the semiconductor device on a thermoplastic resin sheet;

forming a thermoplastic resin portion for covering a portion of the semiconductor device except for end surfaces of the bumps by melting the thermoplastic resin sheet through hot pressing of the thermoplastic resin sheet and the semiconductor device; and cutting the thermoplastic resin portion after the hot pressing.

According to a second aspect of the present invention, there is provided a semiconductor device package manufacturing method comprising:

forming by a wire bonding method a bump on an element electrode of a semiconductor device of an individual piece obtained by dicing a semiconductor wafer;

positioning one or a plurality of the semiconductor devices on a thermoplastic resin sheet;

forming a thermoplastic resin portion for covering a portion of the semiconductor device except for an end surface of the bump by melting the thermoplastic resin sheet through hot pressing of the thermoplastic resin sheet and each individual piece of the semiconductor device; and cutting the thermoplastic resin portion after the hot pressing.

According to a third aspect of the present invention, there is provided a semiconductor device package manufacturing method comprising:

forming bumps on semiconductor device electrodes of a semiconductor wafer by a wire bonding method;

dicing the semiconductor wafer on which the bump is formed to divide the wafer into each individual piece of a semiconductor device;

positioning one or a plurality of the semiconductor devices on a thermoplastic resin sheet;

forming a thermoplastic resin portion for covering a portion of the semiconductor device except for end surfaces of the bumps by melting the thermoplastic resin sheet through hot pressing of the thermoplastic resin sheet and each individual piece of the semiconductor device; and cutting the thermoplastic resin portion after the hot pressing.

According to a fourth aspect of the present invention, there is provided a semiconductor device package manufacturing method comprising:

forming bumps on element electrodes of a semiconductor wafer by a wire bonding method;

positioning a thermoplastic resin sheet on the semiconductor wafer;

forming a thermoplastic resin portion for covering a portion of the semiconductor device except for end surfaces of the bumps by melting the thermoplastic resin sheet through hot pressing of the semiconductor wafer and the thermoplastic resin sheet; and dicing the semiconductor wafer and the thermoplastic resin portion, which have undergone the hot pressing.

According to a fifth aspect of the present invention, there is provided a semiconductor device package manufacturing method comprising:

printing a circuit pattern with a conductive paste in a thermoplastic resin portion that is located on an end surface side where the bump is exposed and belongs to a semiconductor device package manufactured by the semiconductor device package manufacturing method defined in the first or second or third aspect;

hardening the conductive paste with a metallic particle arranged in a specified position of the circuit pattern;

forming a thermoplastic resin portion for covering a portion of the semiconductor device except for an end surface of the metallic particle by positioning the semiconductor device package obtained after the hardening of the conductive paste on the thermoplastic resin sheet and melting the thermoplastic resin sheet through hot pressing; and cutting the thermoplastic resin portion after the hot pressing.

According to a sixth aspect of the present invention, there is provided a semiconductor device package manufacturing method comprising:

printing a circuit pattern with a conductive paste on an electrode surface side of a semiconductor device package manufactured by the semiconductor device package manufacturing method defined in the fifth aspect;

hardening the conductive paste with a metallic particle arranged in a specified position of the circuit pattern;

forming a thermoplastic resin portion for covering a portion of the semiconductor device except for an end surface of the metallic particle by positioning the semiconductor device package obtained after the hardening of the conductive paste on the thermoplastic resin sheet and melting the thermoplastic resin sheet through hot pressing; and repeating cutting of the thermoplastic resin portion after the hot pressing in specified times, thereby forming a multi-layer package.

According to a seventh aspect of the present invention, there is provided a semiconductor device package manufacturing method comprising:

printing a circuit pattern with a conductive paste on an electrode surface side of the semiconductor wafer before the dicing of the semiconductor wafer and the thermoplastic resin portion, which have undergone the hot pressing, according to the semiconductor device package manufacturing method of the fourth aspect;

hardening the conductive paste with a metallic particle arranged in a specified position of the circuit pattern;

forming a thermoplastic resin portion for covering a portion of the semiconductor device except for an end surface of the metallic particle by aligning in position the semiconductor wafer obtained after the hardening of the conductive paste with the thermoplastic resin sheet and melting the thermoplastic resin sheet through hot pressing; and dicing the semiconductor wafer that has the metallic particle and has undergone the hot pressing.

According to an eighth aspect of the present invention, there is provided a semiconductor device package manufacturing method comprising:

printing a circuit pattern with a conductive paste on an electrode surface side of the semiconductor wafer before the dicing of the semiconductor wafer and the thermoplastic resin portion, which have undergone the hot pressing, according to the semiconductor device package manufacturing method of the fourth aspect;

hardening the conductive paste with a metallic particle arranged in a specified position of the circuit pattern; and obtaining a multi-layer structure by repeating in specified times process of forming a thermoplastic resin portion for covering a portion of the semiconductor device except for an end surface of the metallic particle by aligning in position the semiconductor wafer obtained after the hardening of the conductive paste with the thermoplastic resin sheet and melting the thermoplastic resin sheet through hot pressing, and thereafter dicing the semiconductor wafer that has the metallic particle and has undergone the hot pressing.

According to a ninth aspect of the present invention, there is provided a semiconductor device package manufacturing method as defined in any one of the first through eighth aspects, wherein when the thermoplastic resin portion is formed, the thermoplastic resin sheet is melted and thereby covering the surface of the semiconductor device on which the bump is formed except for the end surface of the semiconductor device.

According to a tenth aspect of the present invention, there is provided an electronic component module manufacturing method comprising:

printing a circuit pattern with a conductive paste on a first thermoplastic resin sheet;

mounting a semiconductor device package manufactured by the semiconductor device package manufacturing method defined in any one of the first through eighth aspects and an electronic component at specified positions of the circuit pattern of the first thermoplastic resin sheet; and forming a thermoplastic resin portion for covering the semiconductor package and the electronic component by aligning in position a second thermoplastic resin sheet with the first thermoplastic resin sheet on which the semiconductor device package and the electronic component are mounted and melting the second thermoplastic resin sheet through hot pressing.

According to an 11th aspect of the present invention, there is provided an electronic component module manufacturing method as defined in the 10th aspect, wherein when the thermoplastic resin portion is formed, a surface of the semiconductor device on which the bump is formed except for the end surface of the bump of the semiconductor device by melting the thermoplastic resin sheet.

According to a 12th aspect of the present invention, there is provided a method for manufacturing a noncontact IC card having an antenna coil for executing transmission and reception between an IC chip and outside, the method comprising:

printing a circuit pattern capable of being electrically connected to an IC electrode portion of the IC chip or a circuit pattern to be electrically connected to the IC electrode portion including a coil pattern that constitutes the antenna coil on a thermoplastic resin base material with a conductive paste;

arranging a semiconductor device package on the circuit pattern in a manner that the IC electrode portion of the IC chip of the semiconductor device package that has the IC chip and is manufactured by the semiconductor device package manufacturing method defined in any one of the first through ninth aspects is connected to the circuit pattern;

hardening the conductive paste;

forming a thermoplastic resin portion for covering the semiconductor device package by aligning in position a thermoplastic resin sheet on a semiconductor device package mounting surface side of the thermoplastic resin base material obtained after the hardening of the conductive paste and melting the thermoplastic resin sheet through hot pressing; and cutting the thermoplastic resin portion after the hot pressing, forming the card.

According to a 13th aspect of the present invention, there is provided a semiconductor device package manufactured by the semiconductor device package manufacturing method defined in any one of the first through eighth aspects.

According to a 14th aspect of the present invention, there is provided a semiconductor device package manufactured by the semiconductor device package manufacturing method defined in the ninth aspect.

According to a 15th aspect of the present invention, there is provided a semiconductor device-mounted component manufacturing method for performing mounting of a semiconductor device on a circuit pattern, which is electrically connected to the semiconductor device while being brought in contact with a bump of the semiconductor device a nd is formed of a conductive paste on a pattern forming surface of a base material, the method comprising:

inserting the semiconductor device into the base material with the bump of the semiconductor device put in an exposed state proximately to the pattern forming surface; and forming a contact area increasing portion for increasing a contact area of the circuit pattern with the bump on the bump exposed on the pattern forming surface.

According to a 16th aspect of the present invention, there is provided a semiconductor device-mounted component manufacturing method as defined in the 15th aspect, wherein the contact area increasing portion is formed of an extension portion-forming member brought in contact with the bump or the pattern forming surface located in a vicinity of the bump when the contact area is increased, and the extension portion-forming member is pressurized against the bump or the pattern forming surface located in the vicinity of the bump.

According to a 17th aspect of the present invention, there is provided a semiconductor device-mounted component manufacturing method as defined in the 16th aspect, wherein, when the extension portion-forming member has a cylindrical shape, a projecting portion is formed as the contact area increasing portion on the bump formed by a pressurizing operation for performing pressurization with the extension portion-forming member.

According to an 18th aspect of the present invention, there is provided a semiconductor device-mounted component manufacturing method as defined in the 16th aspect, wherein, when the extension portion-forming member has a rugged portion at its tip, a rugged portion is formed as the contact area increasing portion on the bump formed by a pressurizing operation for performing pressurization with the extension portion-forming member.

According to a 19th aspect of the present invention, there is provided a semiconductor device-mounted component manufacturing method as defined in the 16th aspect, wherein, when the extension portion-forming member has a cylindrical shape, a contact area increasing groove is formed in the vicinity of the bump by pressurizing the pattern forming surface in the vicinity of the bump by a pressurizing operation for performing pressurization with the extension portion-forming member, thus exposing the bump from the base material.

According to a 20th aspect of the present invention, there is provided a semiconductor device-mounted finished-product manufacturing method for encapsulating a semiconductor device-mounted component manufactured by the semiconductor device-mounted component manufacturing method defined in any one of the 15th through 19th aspects.

According to a 21st aspect of the present invention, there is provided a semiconductor device-mounted finished-product provided with a semiconductor device-mounted component manufactured by the semiconductor device-mounted component manufacturing method defined in any one of the 15th through 19th aspects.

According to a 22nd aspect of the present invention, there is provided a semiconductor device-mounted finished-product manufactured by the semiconductor device-mounted finished-product manufacturing method defined in the 20th aspect.

According to a 23rd aspect of the present invention, there is provided a semiconductor device-mounted finished-product as defined in the 21st aspect, wherein the semiconductor device-mounted finished-product is a noncontact IC card.

According to a 24th aspect of the present invention, there is provided a semiconductor device-mounted finished-product as defined in the 22nd aspect, wherein the semiconductor device-mounted finished-product is a noncontact IC card.

According to a 25th aspect of the present invention, there is provided a semiconductor device-mounted component manufacturing apparatus for performing mounting of a semiconductor device on a circuit pattern, which is electrically connected to the semiconductor device while being brought in contact with a bump of the semiconductor device and is formed of a conductive paste on a pattern forming surface of a base material, the apparatus comprising:

a semiconductor device pressurizing device for inserting the semiconductor device into the base material with the bump of the semiconductor device put in an exposed state or an unexposed state proximately to the pattern forming surface; and a contact area increasing device for forming a contact area increasing portion for increasing a contact area of the circuit pattern with the bump on the bump exposed or located proximately to the pattern forming surface.

According to a 26th aspect of the present invention, there is provided a semiconductor device-mounted component manufacturing apparatus as defined in the 25th aspect, wherein the contact area increasing device comprises:

an extension portion-forming member for forming the contact area increasing portion by coming in contact with the bump or in contact with the pattern forming surface located in the vicinity of the bump; and an extension portion-forming member-use pressurizing device for pressurizing the extension portion-forming member against the bump or the pattern forming surface located in the vicinity of the bump.

According to a 27th aspect of the present invention, there is provided a semiconductor device-mounted component manufacturing apparatus as defined in the 26th aspect, wherein the extension portion-forming member has a cylindrical shape and forms a projecting portion that serves as the contact area increasing portion on the bump formed by a pressurizing operation for performing pressurization with the extension portion-forming member-use pressurizing device.

According to a 28th aspect of the present invention, there is provided a semiconductor device-mounted component manufacturing apparatus as defined in the 26th aspect, wherein the extension portion-forming member has at its tip a rugged portion and forms a rugged portion as the contact area increasing portion on the bump formed by a pressurizing operation for performing pressurization with the extension portion-forming member-use pressurizing device.

According to a 29th aspect of the present invention, there is provided a semiconductor device-mounted component manufacturing apparatus as defined in the 26th aspect, wherein the extension portion-forming member has a cylindrical shape and forms a contact area increasing groove in the vicinity of the bump by pressurizing the pattern forming surface located in the vicinity of the bump by a pressurizing operation for performing pressurization with the extension portion-forming member-use pressurizing device, thus exposing the bump from the base material.

According to a 30th aspect of the present invention, there is provided a semiconductor device-mounted finished-product manufacturing apparatus comprising:

the semiconductor device-mounted component manufacturing apparatus defined in any one of the 25th through 29th aspects; and an encapsulating device for encapsulating the semiconductor device-mounted component manufactured by the semiconductor device-mounted component manufacturing apparatus.

According to a 31st aspect of the present invention, there is provided a semiconductor device-mounted finished-product comprising the semiconductor device-mounted component manufactured by the semiconductor device-mounted component manufacturing apparatus defined in any one of the 25th through 29th aspects.

According to a 32nd aspect of the present invention, there is provided a semiconductor device-mounted finished-product manufactured by the semiconductor device-mounted finished-product manufacturing apparatus defined in the 30th aspect.

According to a 33rd aspect of the present invention, there is provided a semiconductor device-mounted finished-product defined in the 31st aspect, wherein the semiconductor device-mounted finished-product is a noncontact IC card.

According to a 34th aspect of the present invention, there is provided a semiconductor device-mounted finished-product defined in the 32nd aspect, wherein the semiconductor device-mounted finished-product is a noncontact IC card.

BRIEF DESCRIPTION OF DRAWINGS

These and other aspects and features of the present invention will become clear from the following description taken in conjunction with the preferred embodiments thereof with reference to the accompanying drawings, in which:

FIG. 2 is a process chart showing the semiconductor device package manufacturing method of the first embodiment of the present invention;

FIG. 7 is a process chart showing a semiconductor device package manufacturing method according to a third embodiment of the present invention;

FIG. 15 is a process chart showing the electronic component module manufacturing method of the sixth embodiment;

FIG. 19 is a process chart showing the conventional semiconductor device package manufacturing method;

DETAILED DESCRIPTION OF THE INVENTION

Figure 1A:
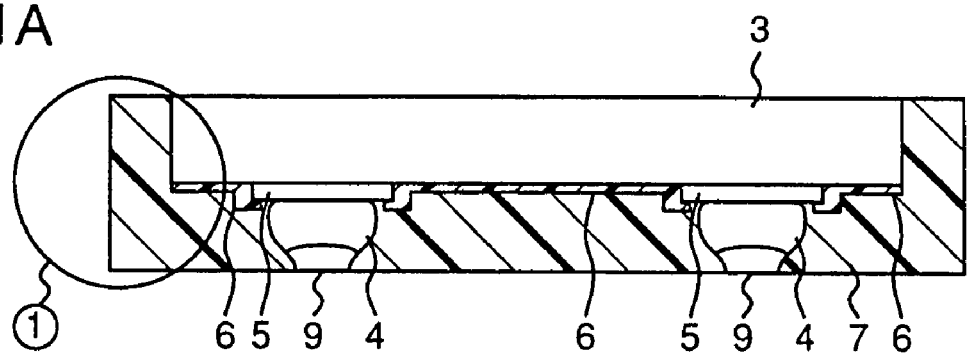
FIG. 1A and FIG. 1B are partial sectional views of a semiconductor device package manufactured by a semiconductor device package manufacturing method according to a first embodiment and a second embodiment, respectively, of the present invention.

Before the description of the present invention proceeds, it is to be noted that like parts are designated by like reference numerals throughout the accompanying drawings.

Several embodiments of the present invention will be described below with reference to the accompanying drawings, for the understanding of the present invention. It is to be noted that the following embodiments are each one materialized example of the present invention and do not limit the technological scope of the present invention.

FIRST EMBODIMENT AND SECOND EMBODIMENT

Figure 1B:
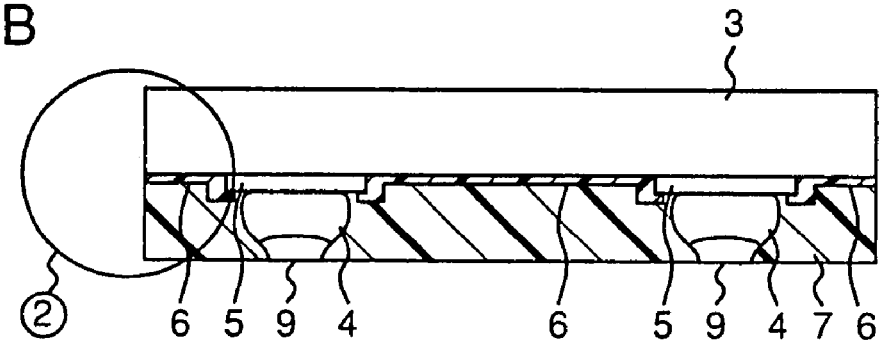

FIG. 1A and FIG. 1B are partial sectional views showing the schematic constructions of semiconductor device packages according to the first embodiment and the second embodiment of the present invention.

As shown in FIG. 1A, the semiconductor device package of the first embodiment is constructed of a semiconductor device 3 in which a bump 4 is formed on each element electrode 5 by the wire bonding method and a thermoplastic resin portion 7 that covers the periphery of the semiconductor device 3. As shown in FIG. 1A, the end surface 9 of each bump 4 is exposed on the surface of the thermoplastic resin portion 7, providing a structure for enabling electrical connection to the outside. In FIG. 1A, the reference numeral 6 denotes a passivation film for protecting the active surface of the semiconductor device 3.

Although the end surfaces of the side portions of the semiconductor device 3 are structured so as to be covered with the thermoplastic resin portion 7 as indicated by the encircled number 1 (①) in FIG. 1A, it is acceptable to adopt a structure in which the end surfaces of the side portions of the semiconductor device 3 are exposed as indicated by the encircled number 2 (②) in FIG. 1B.

The above difference is attributed to the difference in the semiconductor device package manufacturing method described in detail below.

FIRST EMBODIMENT

Figure 4A:
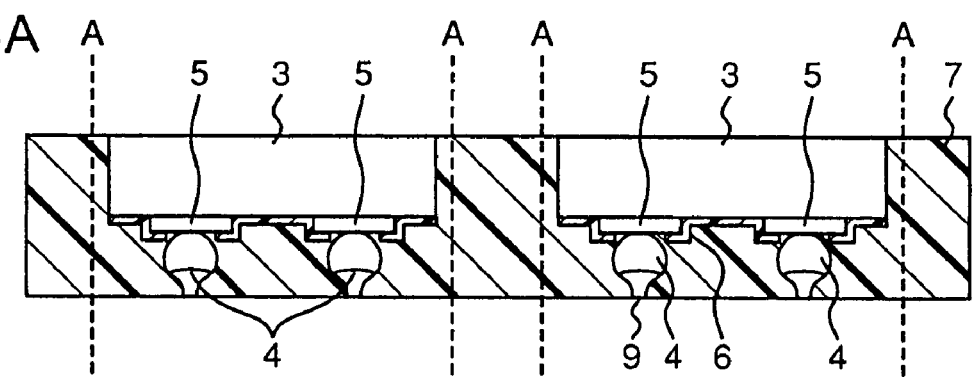
FIG. 4A and FIG. 4B are partial sectional views for explaining the semiconductor device package manufacturing method of the first embodiment of FIG. 2, continued from FIG. 3E.
Figure 4B:
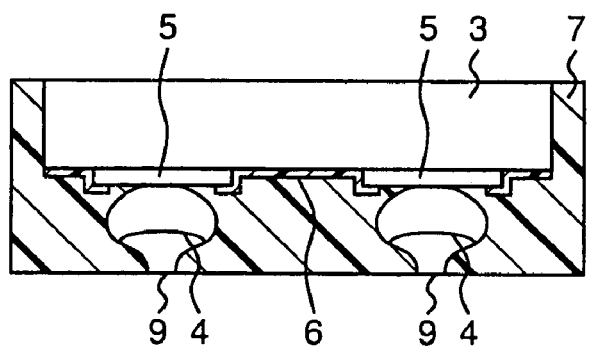
Figure 5A:
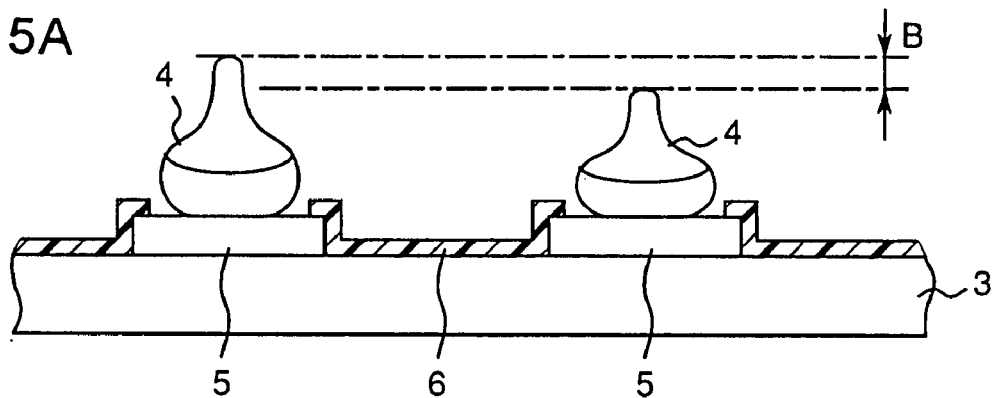
FIG. 5A, FIG. 5B and FIG. 5C are partial sectional views for explaining the external appearance of bumps on semiconductor device electrodes of the first embodiment.
Figure 5B:
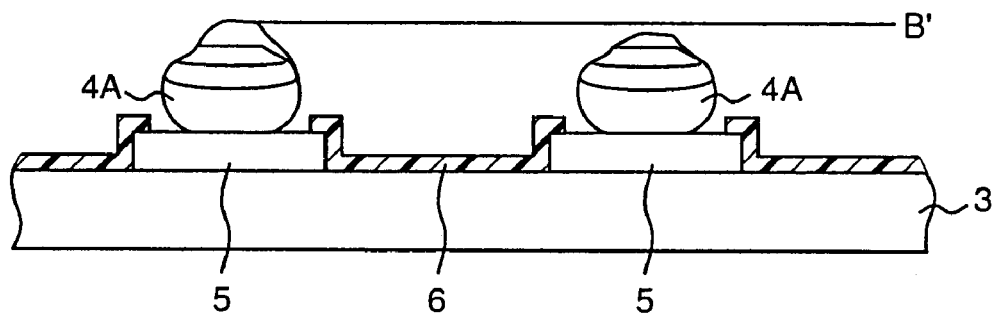
Figure 5C:
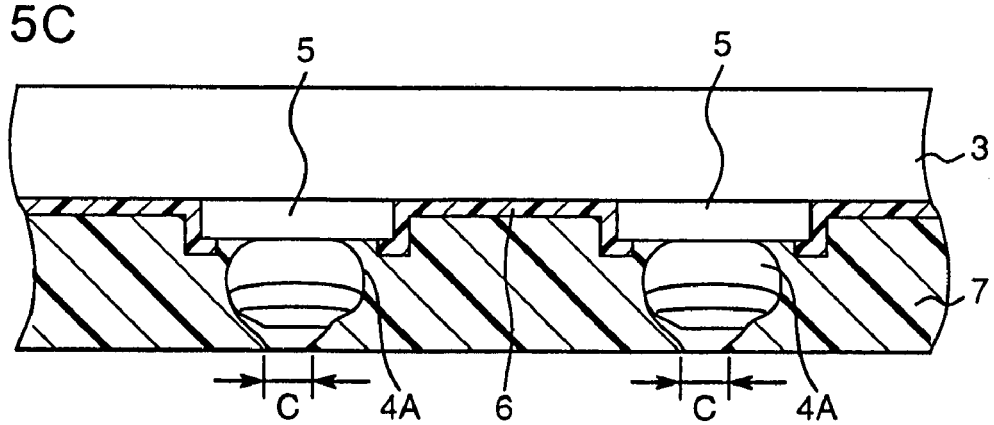

FIG. 2 is a process chart showing the semiconductor device package manufacturing method of the first embodiment of the present invention. FIG. 3A, FIG. 3B, FIG. 3C, FIG. 3D and FIG. 3E are partial sectional views for explaining the semiconductor device package manufacturing method of the first embodiment of FIG. 2. FIG. 4A and FIG. 4B are partial sectional views for explaining the semiconductor device package manufacturing method of the first embodiment of FIG. 2, continued from FIG. 3E. FIG. 5A, FIG. 5B and FIG. 5C are partial sectional views for explaining the external appearance of the bumps on the semiconductor device electrode of the first embodiment.

Figure 3A:
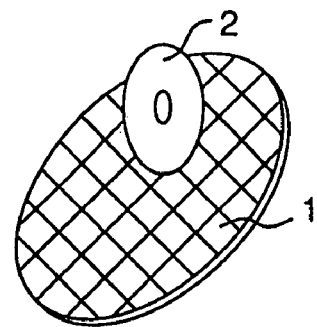
FIG. 3A, FIG. 3B, FIG. 3C, FIG. 3D, and FIG. 3E are partial sectional views for explaining the semiconductor device package manufacturing method of the first embodiment of FIG. 2.

In FIG. 3A, reference numeral 1 denotes a semiconductor wafer and 2 denotes a dicing saw. In step S1 of FIG. 2, the semiconductor wafer 1 is diced to be divided into each piece of the semiconductor device 3.

Figure 3B:
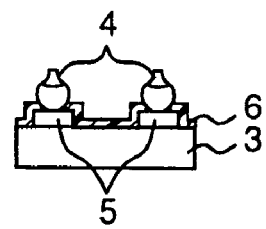

Next, in step S2, as shown in FIG. 3B, a bump 4 is formed on each element electrode 5 of the semiconductor device 3 divided into each individual piece by the wire bonding method using a metallic wire formed of Au, Cu, solder, or the like.

Figure 3C:
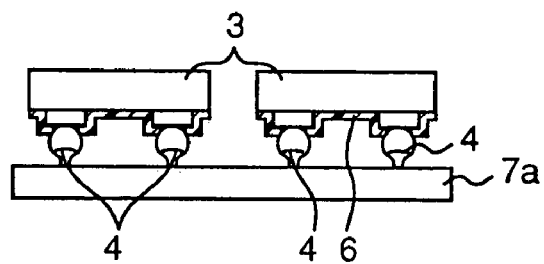

Next, in step S3, as shown in FIG. 3C, one or a plurality of semiconductor devices 3 on which the bumps 4 have been formed are mounted on a sheet 7a formed of a thermoplastic resin of polyethylene terephthalate, vinyl chloride, polycarbonate, acrylonitrile butadiene styrene, or the like. The thickness of the thermoplastic resin sheet 7a is preferably basically not greater than a total thickness of the thickness of the semiconductor device 3 and the height of the bump 4. For example, when the thickness of the semiconductor device 3 is 0.18 mm and the height of the bump 4 is 0.04 mm, there is employed a thermoplastic resin sheet 7a of a thickness of 0.2 mm.

Figure 3D:
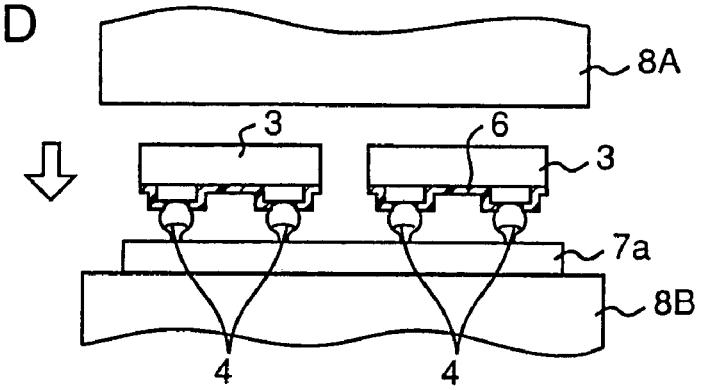
Figure 3E:
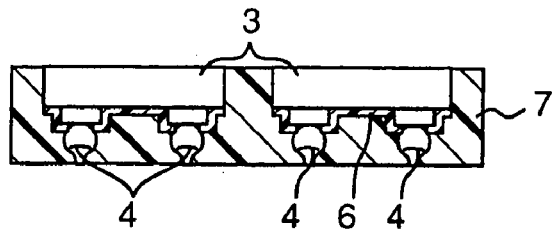

Next, in step S4, as shown in FIG. 3D, by placing the thermoplastic resin sheet 7a on a hot pressing plate 8B arranged opposite to a hot pressing plate 8A, holding the thermoplastic resin sheet 7a on which the semiconductor device 3 is mounted between the hot pressing plates 8A and 8B, and pressurizing the hot pressing plate 8A against the hot pressing plate 8B relative to each other, hot pressing is carried out to melt the thermoplastic resin sheet 7a, with which the surface of the semiconductor device 3 except for the upper surface is covered and the side surfaces of the bumps 4 of the semiconductor device 3 are covered, exposing only the end surfaces 9 of the bumps. The melted thermoplastic resin sheet 7a is cooled to constitute the thermoplastic resin portion 7. With regard to the hot pressing conditions, when, for example, polyethylene terephthalate is employed for the thermoplastic resin sheet 7a, the conditions include a pressure of 30 kg/cm$^2$ (about 30×10$^5$ Pa), a temperature of 120° C., and a pressing time of one minute. It is to be noted that the temperature and the pressure are varied depending on the material of the thermoplastic resin sheet 7a. FIG. 3E is a sectional view showing a state after the hot pressing.

Next, in step S5, the thermoplastic resin portion 7 is cut in specified positions A shown in FIG. 4A. A distance from the end surface of the side portion of the semiconductor device 3 to the cutting position A is not particularly specified.

Through the aforementioned processes, a semiconductor device package of the first embodiment is completed in step S7 as shown in FIG. 4B. This is the semiconductor device package shown in FIG. 1A.

The bump 4 formed on the electrode 5 of the semiconductor device 3 may be a bump 4 of the shape shown in FIG. 5A (generally called the ton-off bump) or a bump 4A of the shape shown in FIG. 5B (generally called the two-step projection bump). However, the two-step projection bump 4A that has a small height variation dimension B is more desirable because the area C of the end surface 9 of the bump 4 exposed from the surface of the thermoplastic resin portion 7 after the hot pressing is more stabilized as shown in FIG. 5C.

Figure 21:
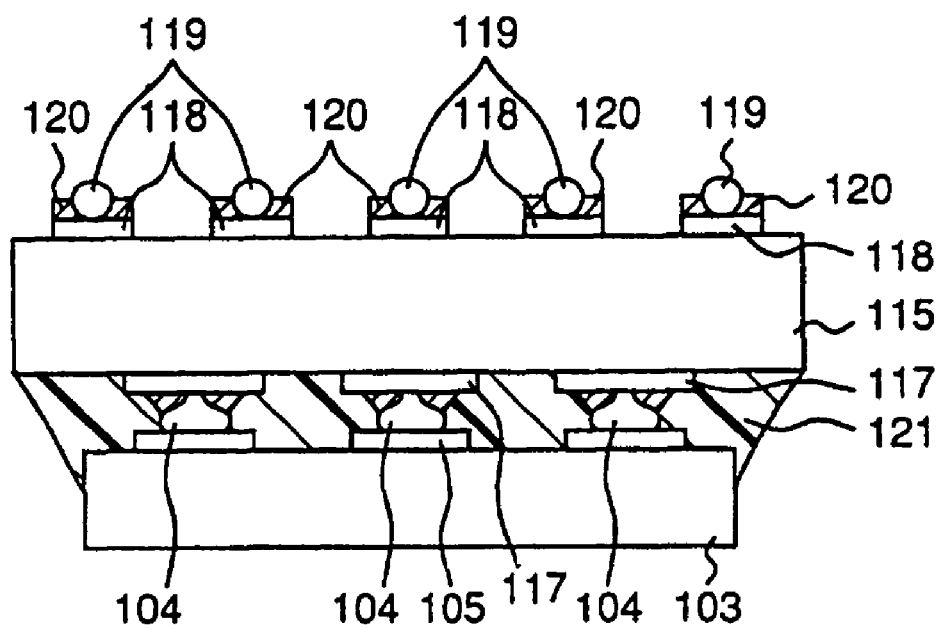
FIG. 21 is a partial sectional view for explaining the conventional semiconductor device package.

In this first embodiment, the semiconductor device package, which has the total thickness of those of the semiconductor device 3 and the thermoplastic resin portion 7 as shown in step S7 of FIG. 2, can be remarkably reduced in thickness, dissimilar to the semiconductor device package shown in the prior art example of FIG. 21. Moreover, because of the absence of the conductive adhesive 16 and the encapsulant 21 shown in FIG. 21 and because of no time required for the hardening of the conductive adhesive and the encapsulant, the productivity can be remarkably improved.

SECOND EMBODIMENT

Figure 6:
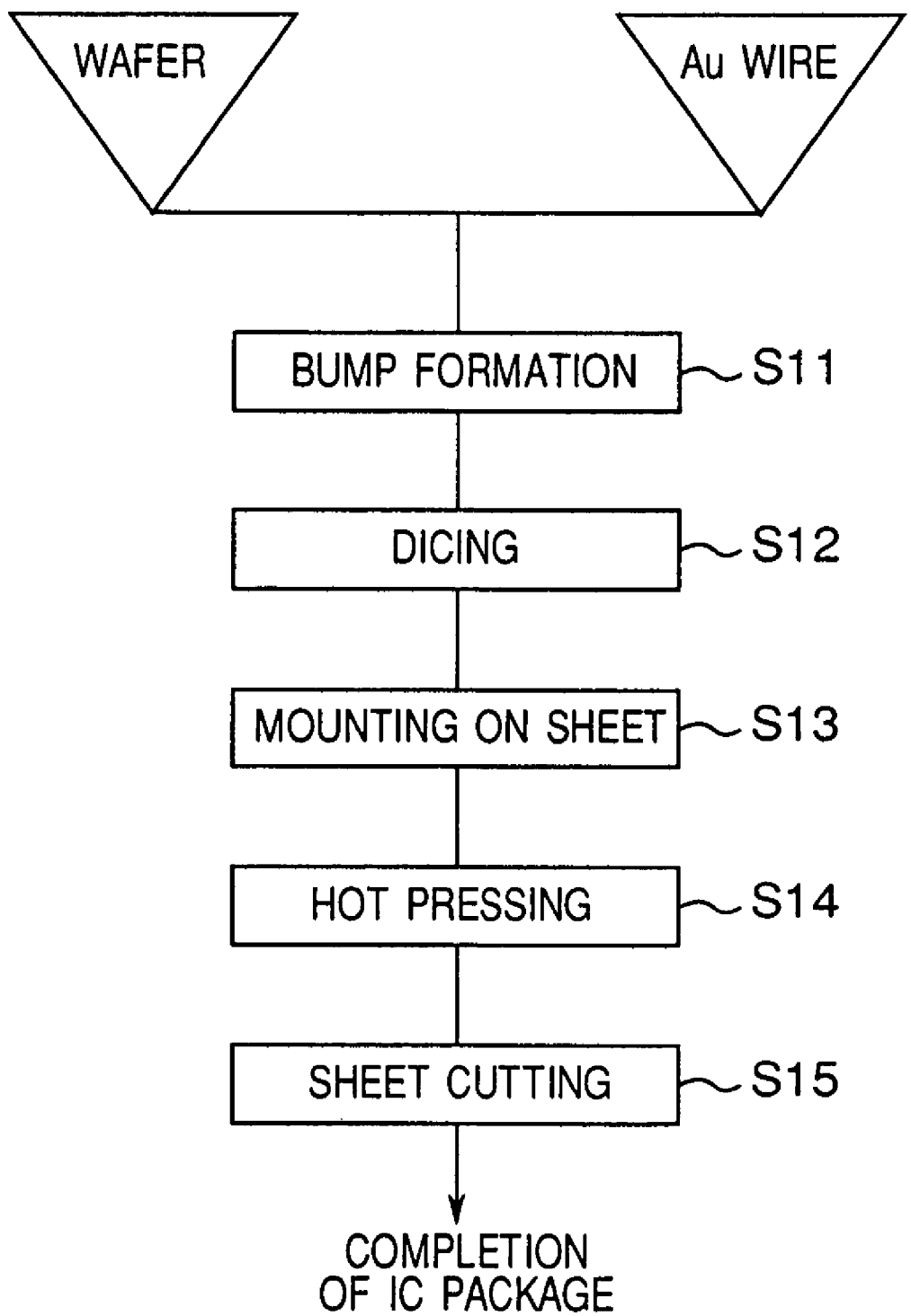
FIG. 6 is a process chart showing the semiconductor device package manufacturing method of the second embodiment of the present invention.

FIG. 6 is a process chart showing the semiconductor device package manufacturing method of the second embodiment of the present invention. The semiconductor device package manufacturing method of the second embodiment differs from the first embodiment in that bumps 4 are formed in the state of the semiconductor wafer 1 in step S11 of FIG. 6 and thereafter dicing is performed in step S12 for the division into each individual piece of the semiconductor device 3. This second embodiment is similar to the steps S3, S4 and S5 of the first embodiment in the points of the mounting on the thermoplastic resin sheet 7a in step S13, the hot pressing performed in step S14, and the cutting of the thermoplastic resin portion 7 in step S15, respectively.

Even in this second embodiment, the semiconductor device package, which has the total thickness of those of the semiconductor device 3 and the thermoplastic resin portion 7, can be remarkably reduced in thickness, dissimilar to the semiconductor device package shown in the prior art example of FIG. 21. Moreover, because of the absence of the conductive adhesive 16 and the encapsulant 21 shown in FIG. 21 and because of no time required for the hardening of the conductive adhesive and the encapsulant, the productivity can be remarkably improved.

THIRD EMBODIMENT

Figure 8A:
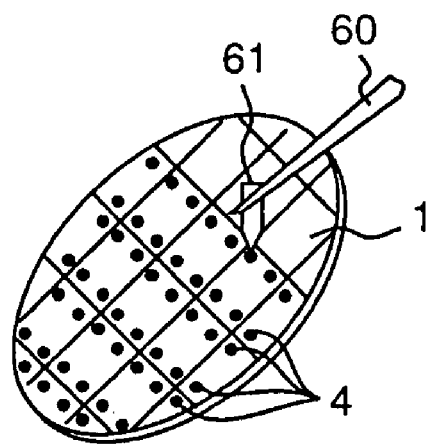
FIG. 8A, FIG. 8B and FIG. 8C are explanatory views for explaining the semiconductor device package manufacturing method of the third embodiment of FIG. 7.
Figure 8B:
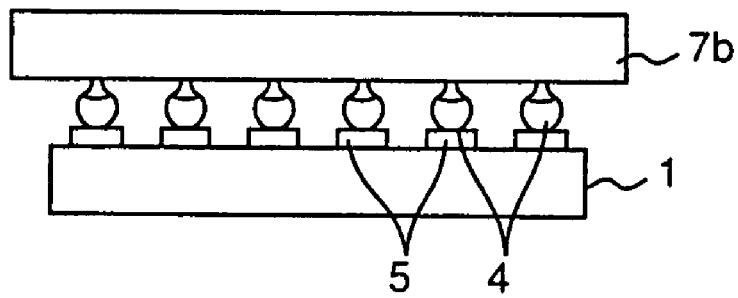
Figure 8C:
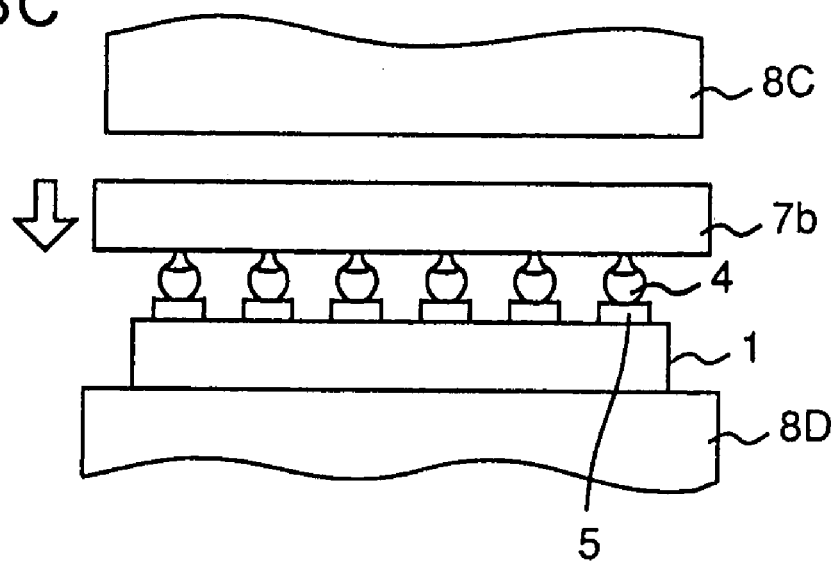
Figure 9A:
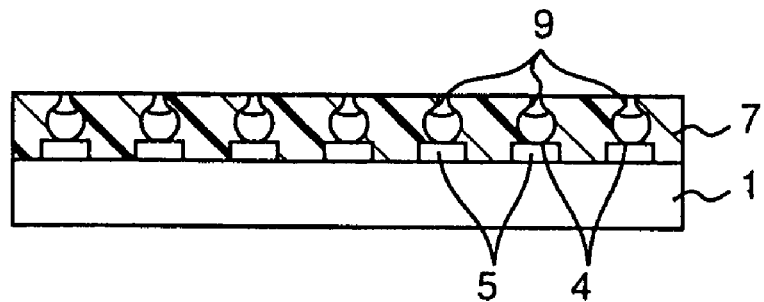
FIG. 9A, FIG. 9B and FIG. 9C are partial sectional views for explaining the semiconductor device package manufacturing method of the third embodiment of FIG. 7, continued from FIG. 8C.
Figure 9B:
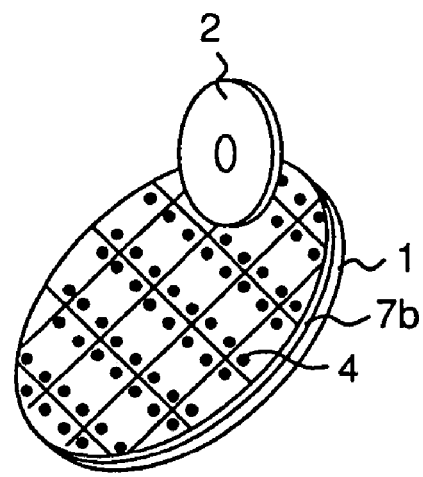
Figure 9C:
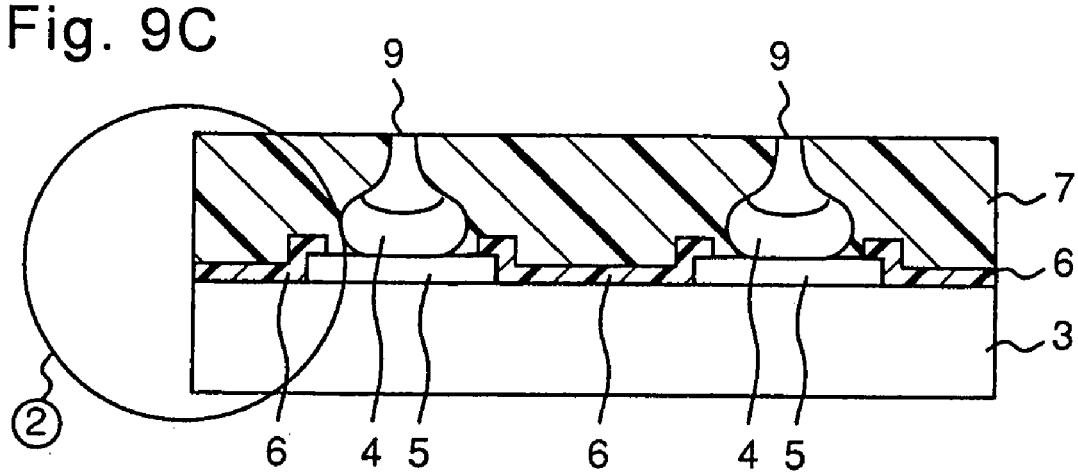

Next, FIG. 7 is a process chart showing the semiconductor device package manufacturing method of the third embodiment of the present invention. FIG. 8A, FIG. 8B and FIG. 8C are explanatory views for explaining the semiconductor device package manufacturing method of the third embodiment of FIG. 7. FIG. 9A, FIG. 9B and FIG. 9C are partial sectional views for explaining the semiconductor device package manufacturing method of the third embodiment of FIG. 7, continued from FIG. 8C.

In step S21 of FIG. 7, as shown in FIG. 8A, a bump 4 is formed on each electrode element of a semiconductor wafer 1 by the wire bonding method. The reference numeral 61 denotes a capillary that is provided for a wire bonding device and holds a metallic wire formed of Au, Cu, solder, or the like, while the reference numeral 60 denotes a horn that belongs to the wire bonding device, holds the capillary 61 and applies a pressure and a supersonic wave.

Next, in step S22, as shown in FIG. 8B, a thermoplastic resin sheet 7b formed of a thermoplastic resin of polyethylene terephthalate, vinyl chloride, polycarbonate, acrylonitrile butadiene styrene, or the like is arranged oppositely to the semiconductor wafer 1 on which the bumps 4 are formed. The thickness of the thermoplastic resin sheet 7b is preferably basically not greater than the height of the bump 4. For example, when the height of the bump 4 is 0.04 mm, there is employed a thermoplastic resin sheet 7b of a thickness of 0.03 mm.

Next, in step S23, as shown in FIG. 8C, by placing the semiconductor wafer 1 on a hot pressing plate 8D arranged opposite to a hot pressing plate 8C, holding the semiconductor wafer 1 and the thermoplastic resin sheet 7b arranged opposite to the semiconductor wafer 1 between the hot pressing plates 8C and 8D, and pressurizing the hot pressing plate 8C against the hot pressing plate 8D relatively to each other, the hot pressing is carried out to melt the thermoplastic resin sheet 7b, with which the upper surface of the semiconductor wafer 1 is covered and the side surfaces of the bumps 4 of the semiconductor wafer 1 are covered, exposing only the end surfaces 9 of the bumps. The melted thermoplastic resin sheet 7b is cooled to constitute the thermoplastic resin portion 7. With regard to the hot pressing conditions, when, for example, polyethylene terephthalate is employed for the thermoplastic resin sheet 7b, the conditions include a pressure of 30 kg/cm$^2$ (about 30×10$^5$ Pa), a temperature of 120° C., and a pressing time of one minute. It is to be noted that the temperature and the pressure are varied depending on the material of the thermoplastic resin sheet 7b. FIG. 9A is a sectional view showing a state after the hot pressing.

Next, in step S24, as shown in FIG. 9B, the semiconductor wafer 1 with the thermoplastic resin portion 7 formed through the hot pressing of the thermoplastic resin sheet 7b is diced by the dicing saw 2 and cut into each individual piece of the semiconductor device 3.

FIG. 9C is a sectional view showing the semiconductor device package 3 obtained after the division, and the semiconductor device 3 shown in FIG. 1B come to have a structure of ② in which the end surfaces of the side portions thereof are exposed.

Through the above-mentioned processes, the semiconductor device package of the third embodiment is completed.

Figure 12:
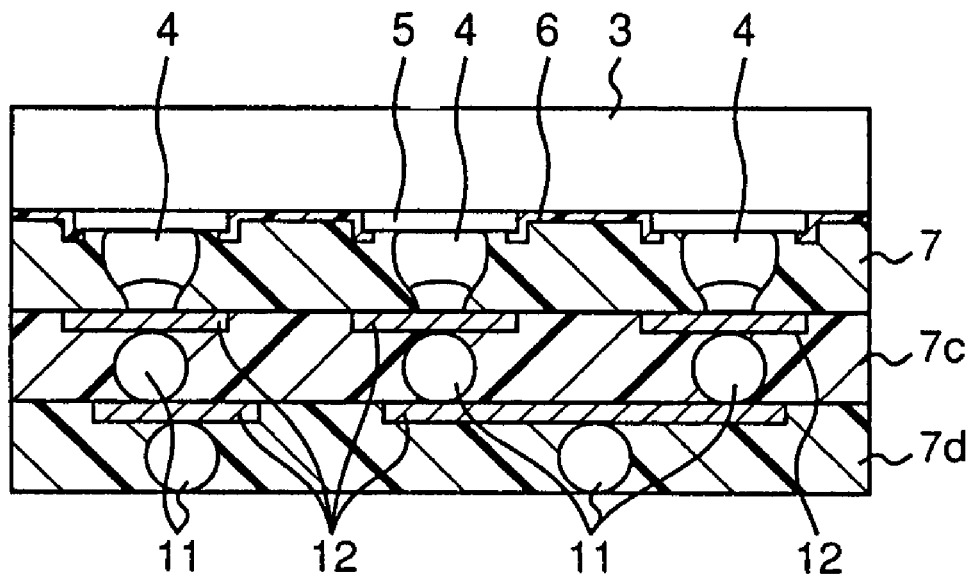
FIG. 12 is a partial sectional view for explaining a semiconductor device package according to a fifth embodiment of the present invention.

Even in this third embodiment, the semiconductor device package, which has the total thickness of those of the semiconductor device 3 and the thermoplastic resin portion 7, can be remarkably reduced in thickness, dissimilar to the semiconductor device package shown in the prior art example of FIG. 12. Moreover, because of the absence of the conductive adhesive 16 and the encapsulant 21 shown in FIG. 21 and because of no time required for the hardening of the conductive adhesive and the encapsulant, the productivity can be remarkably improved.

FOURTH EMBODIMENT

Figure 10A:
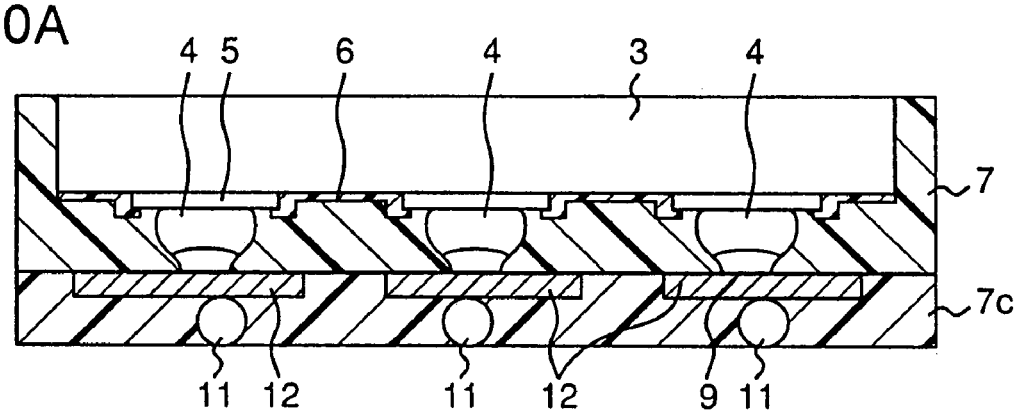
FIG. 10A and FIG. 10B are partial sectional views for explaining a semiconductor device package according to a fourth embodiment of the present invention.
Figure 10B:
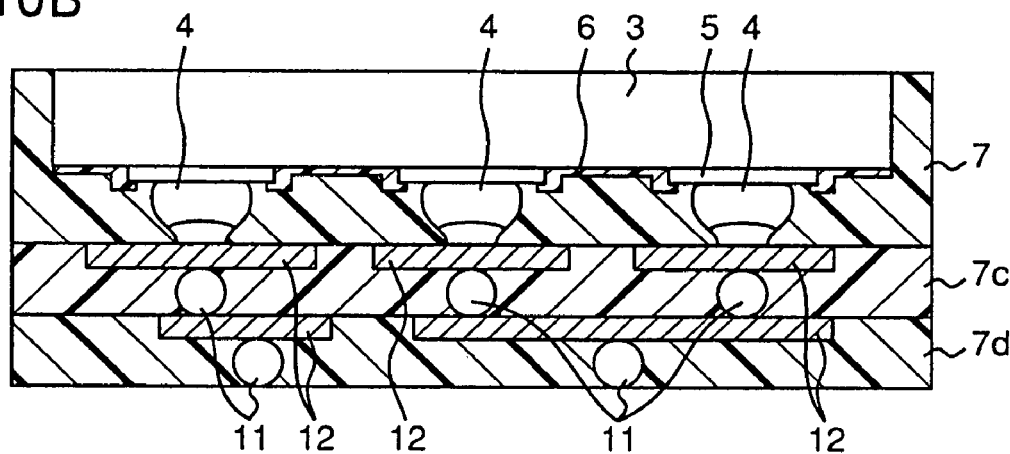
Figure 11:
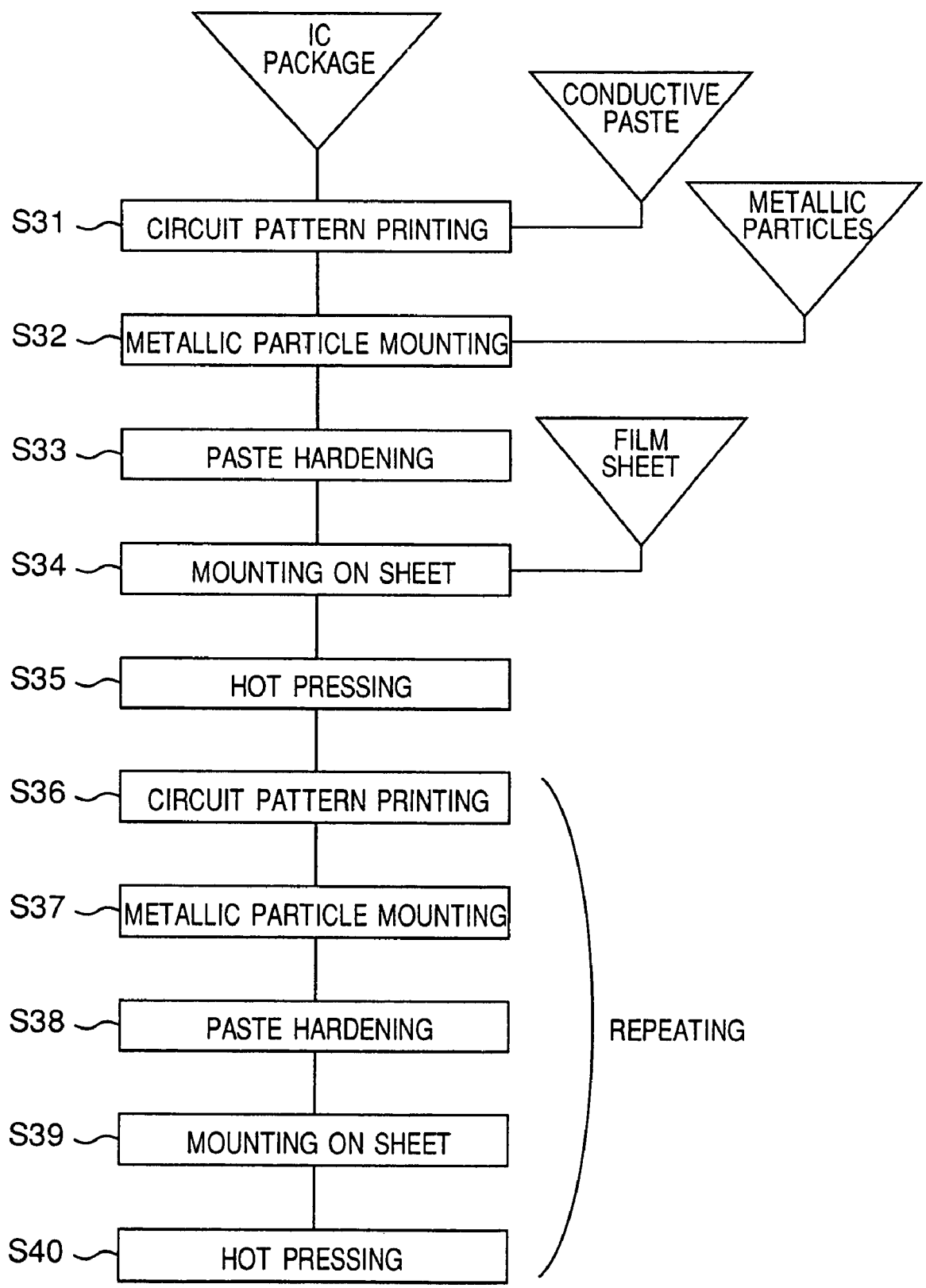
FIG. 11 is a process chart showing the semiconductor device package manufacturing method of the fourth embodiment of FIG. 10A and FIG. 10B.

FIG. 10A and FIG. 10B are partial sectional views for explaining the semiconductor device package of the fourth embodiment of the present invention. FIG. 11 is a process chart showing the semiconductor device package manufacturing method of the fourth embodiment of FIG. 10A and FIG. 10B. In the semiconductor device package of the fourth embodiment, as shown in FIG. 10A and FIG. 10B, the semiconductor device package of the first embodiment or/and the second embodiment shown in FIG. 1A and FIG. 1B has a structure in which a circuit pattern is formed of a conductive paste 12 on a thermoplastic resin portion 7 on which the end surface 9 of each bump 4 is exposed, a metallic particle 11 is mounted on the conductive paste 12 is covered with a thermoplastic resin portion 7c, and the end surface of the metallic particle 11 is exposed on the surface of the thermoplastic resin portion 7c.

First of all, in step S31 of FIG. 11, a circuit pattern is formed of a conductive paste 12 on each electrode end surface side (i.e., the end surface side of each bump 4) of the semiconductor device package shown in FIG. 1A or FIG. 1B manufactured in accordance with the first embodiment or the second embodiment. The conductive paste 12 may be either the thermosetting type or the thermoplastic type.

Next, in step S32, the metallic particles 11 are mounted in specified positions of the circuit pattern formed in the step S31, and the conductive paste 12 for forming the circuit pattern is thermally hardened in step S33.

The metallic particle 11 is provided by Au, Cu, Ni, or the like capable of achieving electric conduction and is allowed to have a spherical or another shape in terms of shape. Its size is determined depending on the thickness of the thermoplastic resin sheet located on the covered side in step S34 and dimensioned so that the end surfaces of the metallic particles 11 are exposed from the thermoplastic resin sheet after the hot pressing in step S35 and able to achieve electric conduction to the outside. For example, when a thermoplastic resin film of a thickness of 100 μm is employed, a metallic particle 11 having a diameter of about 0.5 mm is employed.

Moreover, the thermosetting conditions of the conductive paste 12 have the standard values of 140° C. and about 10 minutes.

In step S34, the thermoplastic resin sheet is arranged oppositely to the surface on which the circuit pattern of the semiconductor device package is formed.

Next, in step S35, by performing hot pressing and cutting the thermoplastic resin sheet as the occasion demands, the semiconductor device package shown in FIG. 10A is completed. In this case, the thermoplastic resin portion 7c is constructed of the thermoplastic resin sheet.

By stopping the process flow after the step S35 without proceeding to step S36, the semiconductor device package shown in FIG. 10A is completed. Further, as the occasion demands, after step S35, by performing the five processes of a circuit pattern printing process of step S36 (process similar to step S31), a metallic particle mounting process of step S37 (process similar to step S32), a paste hardening process of step S38 (process similar to step S33), a mounting process onto a sheet of step S39 (process similar to step S34), and a hot pressing process of step S40 (process similar to step S35), a circuit pattern is formed of the conductive paste 12 on the end surface sides of the metallic particles 11 exposed from the thermoplastic resin portion 7c of the semiconductor package of FIG. 10A, and the metallic particles 11 are mounted in the specified positions of the circuit pattern. The conductive paste 12 is hardened, and after mounting a thermoplastic resin sheet, hot pressing is performed to form another thermoplastic resin portion 7d on the thermoplastic resin portion 7c. With this arrangement, the multi-layered semiconductor package shown in FIG. 10B can be produced. By repeating the five processes of step S36 through S40 in required times, a thermoplastic resin portion including the circuit pattern and the metallic particles 11 can further be formed in the number required on the thermoplastic resin portion 7d.

Even in this fourth embodiment, the semiconductor device package, which has the total thickness of those of the semiconductor device 3 and the thermoplastic resin portion, can be remarkably reduced in thickness, dissimilar to the semiconductor device package shown in the prior art example of FIG. 21. Moreover, because of the absence of the conductive adhesive 16 and the encapsulant 21 shown in FIG. 21 and because of no time required for the hardening of the conductive adhesive and the encapsulant, the productivity can be remarkably improved. Furthermore, a multilayered high-density semiconductor package can be supplied at low cost.

FIFTH EMBODIMENT

Figure 13:
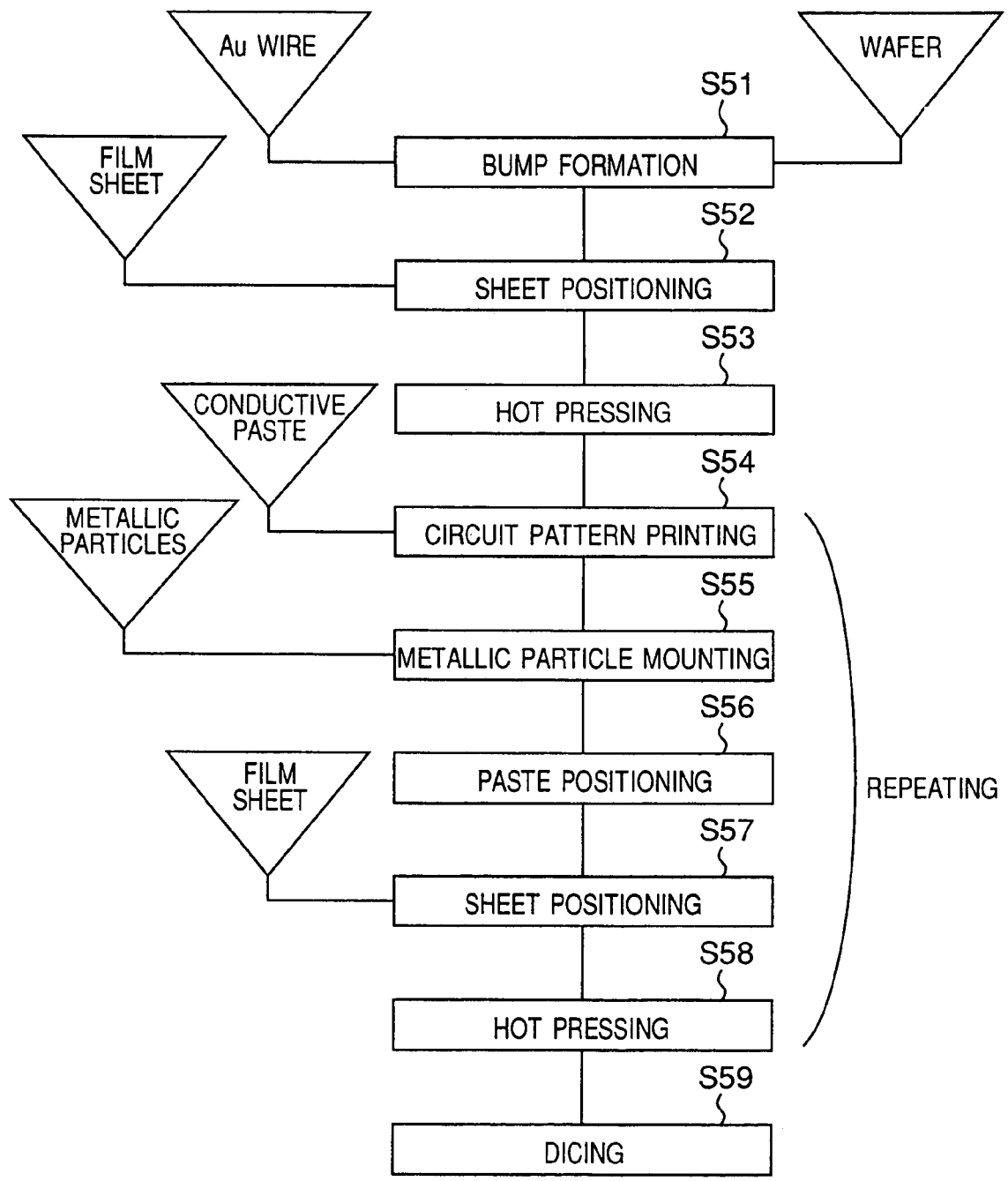
FIG. 13 is a process chart showing the semiconductor device package manufacturing method of the fifth embodiment.

FIG. 12 is a partial sectional view for explaining the semiconductor device package of the fifth embodiment of the present invention. FIG. 13 is a process chart showing the semiconductor device package manufacturing method of the fifth embodiment.

As shown in FIG. 12, according to the semiconductor device package manufacturing method of the fifth embodiment, the semiconductor device package described in connection with the third embodiment has a structure in which a circuit pattern is formed of a conductive paste 12 on a thermoplastic resin portion 7 where the end surface 9 of each bump 4 is exposed, metallic particles 11 mounted on the circuit pattern are covered with a thermoplastic resin portion 7c, and the end surfaces of each metallic particles 11 are exposed on the surface of the thermoplastic resin portion 7c.

Step S51 through step S53 of FIG. 13 are similar to the step S21 through step S23 of FIG. 7 of the third embodiment, i.e., the processes of forming the bumps 4 on the semiconductor wafer 1, then making the thermoplastic resin sheet 7 oppose to the wafer, and performing the hot pressing.

Subsequently, in step S54, a circuit pattern is formed of the conductive paste 12 on the electrode end surface side, i.e., the bump end surface side of the semiconductor wafer 1 against which the thermoplastic resin sheet 7 is hot-pressed. The conductive paste 12 may be either the thermosetting type or the thermoplastic type.

Next, in step S55, the metallic particles 11 are mounted in the specified positions of the circuit pattern, and the conductive paste 12 that forms the circuit pattern is thermally hardened in step S56.

The metallic particle 11 is provided by Au, Cu, Ni, or the like capable of achieving electric conduction and is allowed to have a spherical or another shape. Its size is determined depending on the thickness of a new thermoplastic resin sheet other than the thermoplastic resin sheet 7 located on the covered side and dimensioned so that the end surfaces of the metallic particles 11 are exposed from the thermoplastic resin sheet after the hot pressing and able to achieve electric conduction to the outside. For example, when a thermoplastic resin sheet of a thickness of 100 μm is employed, a metallic particle 11 having a diameter of about 0.5 mm is employed.

Moreover, the thermosetting conditions of the conductive paste 12 have the standard values of 140° C. and about 10 minutes.

Next, in step S57, by using hot pressing plates similar to the hot pressing plates 8C and 8D shown in FIG. 8C, placing the semiconductor wafer 1 on the other hot pressing plate opposite to one hot pressing plate, arranging the thermoplastic resin sheet oppositely to the surface which belongs to the semiconductor wafer 1 and on which the circuit pattern is formed, holding the sheet between the pair of hot pressing plates, and pressurizing one hot pressing plate against the other hot pressing plate relatively to each other, the hot pressing is carried out in step S58 to melt the thermoplastic resin sheet, with which the upper surface of the semiconductor wafer 1 is covered and the side surface of each metallic particle 11 of the semiconductor wafer 1 is covered, exposing only the end surfaces of the particles. The melted thermoplastic resin sheet is cooled to constitute a thermoplastic resin portion 7c. As a result, the thermoplastic resin portion 7c that includes the circuit pattern and the metallic particles 11 is formed on the thermoplastic resin portion 7. By further repeating step S54 through step S58, a thermoplastic resin portion 7d that includes the circuit pattern and the metallic particles can be formed on the thermoplastic resin portion 7c as shown in FIG. 12, allowing the multilayer formation to be easily performed. As described above, by repeating step S54 through step S58 in required times, the required number of thermoplastic resin portions that include the circuit patterns and the metallic particles can be formed on the previously formed thermoplastic resin portion.

Finally, in step S59, by dicing the semiconductor wafer 1 against which the thermoplastic resin sheet is thermally pressed, the semiconductor device package shown in FIG. 12 is completed.

Even in this fifth embodiment, the semiconductor device package, which has the total thickness of those of the semiconductor device and the thermoplastic resin portion, can be remarkably reduced in thickness, dissimilar to the semiconductor device package shown in the prior art example of FIG. 21. Moreover, because of the absence of the conductive adhesive 16 and the encapsulant 21 shown in FIG. 21 and because of no time required for the hardening of the conductive adhesive and the encapsulant, the productivity can be remarkably improved. Furthermore, the multilayered high-density semiconductor package can be supplied at low cost.

SIXTH EMBODIMENT

FIG. 14A, FIG. 14B, FIG. 14C and FIG. 14D are partial sectional views for explaining the electronic component module manufacturing method of the sixth embodiment of the present invention. FIG. 15 is a process chart showing the electronic component module manufacturing method of the sixth embodiment.

The electronic component module manufacturing method of the sixth embodiment is related to electronic component modules that employ the semiconductor device packages described in connection with the first embodiment through the fifth embodiment.

Figure 14A:
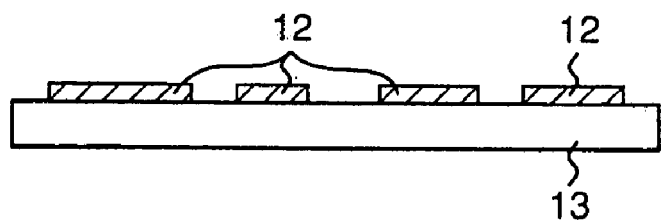
FIG. 14A, FIG. 14B, FIG. 14C and FIG. 14D are partial sectional views for explaining an electronic component module manufacturing method according to a sixth embodiment of the present invention.

As shown in FIG. 14A, in step S61 of FIG. 15, the reference numeral 13 denotes a film substrate formed of a thermoplastic resin of polyethylene terephthalate, vinyl chloride, polycarbonate, acrylonitrile butadiene styrene, or the like. A circuit pattern is formed of a thermosetting or thermoplastic type conductive paste 12 on the film substrate 13.

Figure 14B:
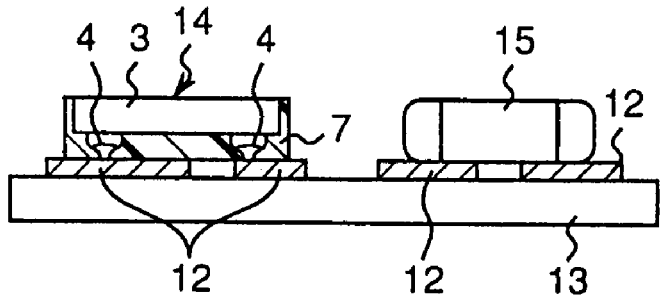

Next, as shown in FIG. 14B, in step S62, a semiconductor package 14 and an electronic component 15 such as a passive component of a resistor, capacitor, or the like are mounted in specified positions of the circuit pattern, and thereafter, the conductive paste 12 is thermally hardened.

Figure 14C:
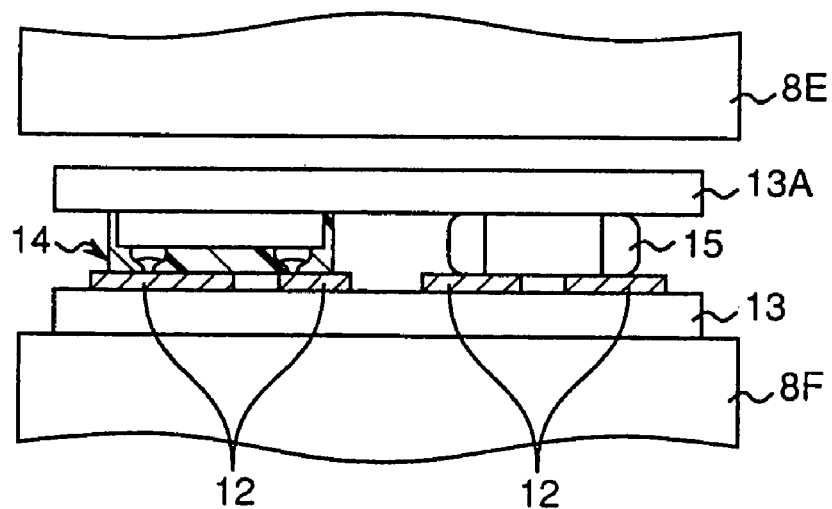
Figure 14D:
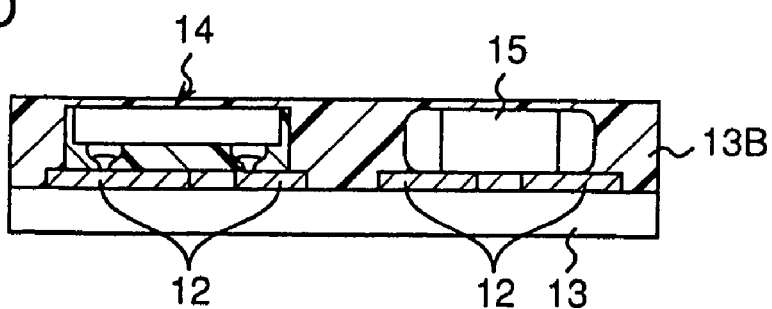

Next, as shown in FIG. 14C, in step S63, a film substrate 13 is placed on a hot pressing plate 8F opposite to a hot pressing plate 8E, and a thermoplastic resin sheet 13A is arranged as a cover sheet on the semiconductor package 14 and the electronic component 15 oppositely to the side on which the circuit board of the film substrate 13 is formed and held between the hot pressing plates 8E and 8F. The thickness of the thermoplastic resin sheet 13A is preferably not smaller than either thicker one of the semiconductor device package 14 or the electronic component 15. Subsequently, in step S64, hot pressing is carried out to melt the thermoplastic resin sheet 13A by pressurizing the hot pressing plate 8E against the hot pressing plate 8F relatively to each other, so that at least the upper surfaces and the side surfaces of the semiconductor package 14 and the electronic component 15 are covered with the sheet. The melted thermoplastic resin sheet 13A is cooled to constitute a thermoplastic resin portion 13B. As a result, the electronic component module shown in FIG. 14D is completed.

According to this sixth embodiment, the electronic component module, which has a thickness almost equal to the total thickness of those of the semiconductor device package 14 and the electronic component 15 and the thermoplastic resin portion, can be reduced in thickness, which cannot be achieved by electronic component module of the prior art example. Moreover, since the thermoplastic resin portion secures the reliability of the semiconductor device and the electronic component, there is required neither encapsulant nor a time for the hardening of the encapsulant, dissimilar to the conventional case, and this allows the productivity to be remarkably improved. Furthermore, the low material cost enables the supply of an inexpensive electronic component module.

SEVENTH EMBODIMENT

FIG. 16A, FIG. 16B, FIG. 16C and FIG. 16D are partial sectional views for explaining the noncontact IC card manufacturing method of the seventh embodiment of the present invention. FIG. 17 is a process chart showing the noncontact IC card manufacturing method of the seventh embodiment.

The seventh embodiment is an example of application to a noncontact IC card constructed of a semiconductor device that has a noncontact IC card-use IC chip and an antenna coil that executes transmission and reception to and from the outside.

Figure 16A:
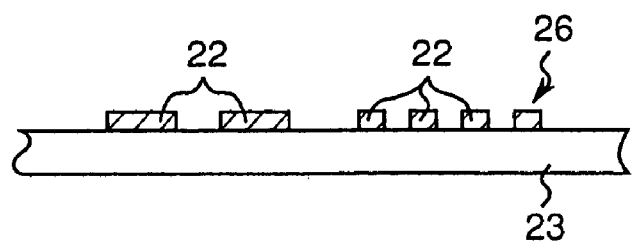
FIG. 16A, FIG. 16B, FIG. 16C and FIG. 16D are partial sectional views for explaining a noncontact IC card manufacturing method according to a seventh embodiment of the present invention.
Figure 17:
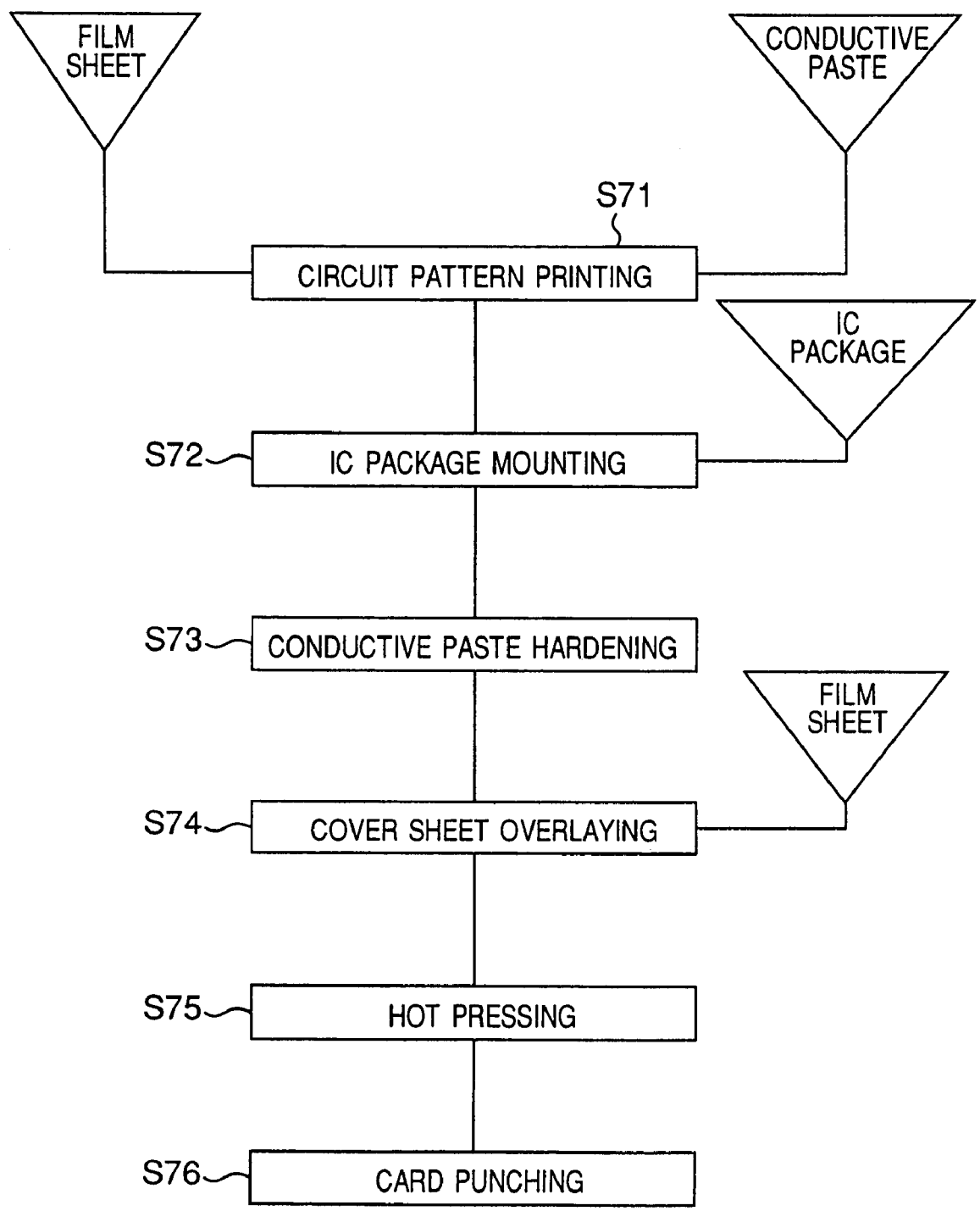
FIG. 17 is a process chart showing the noncontact IC card manufacturing method of the seventh embodiment.
Figure 18:
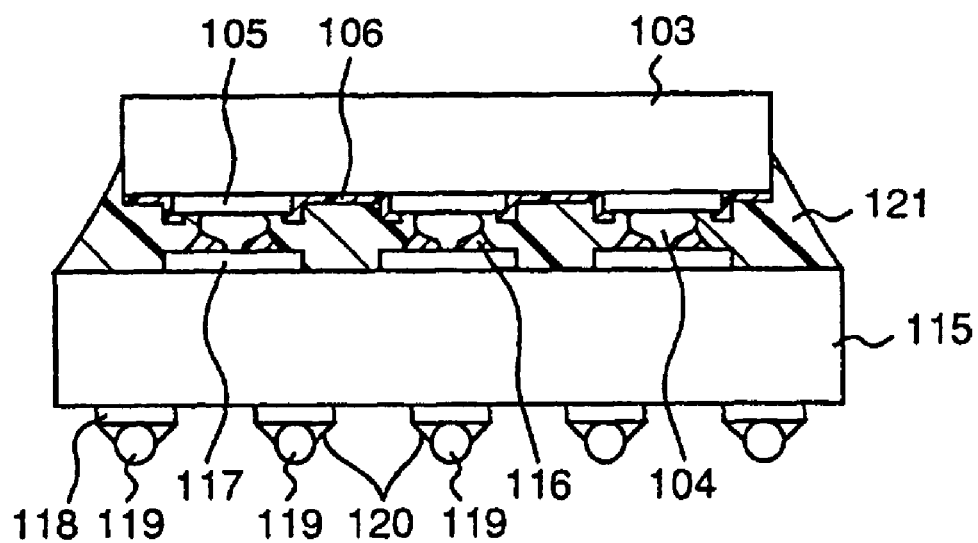
FIG. 18 is a partial sectional view for explaining a conventional semiconductor device package.
Figure 20A:
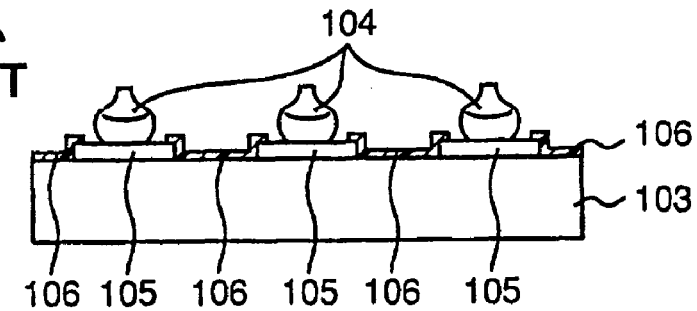
FIG. 20A, FIG. 20B, FIG. 20C and FIG. 20D are partial sectional views for explaining the conventional semiconductor device package.
Figure 20B:
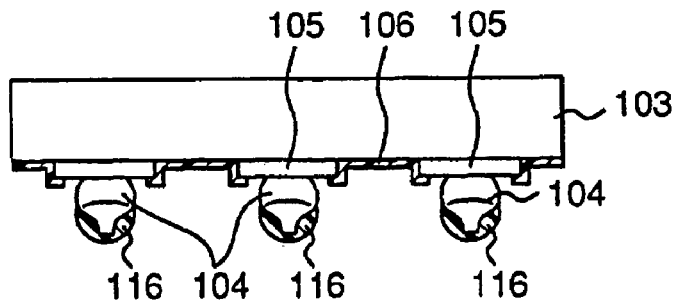
Figure 20C:
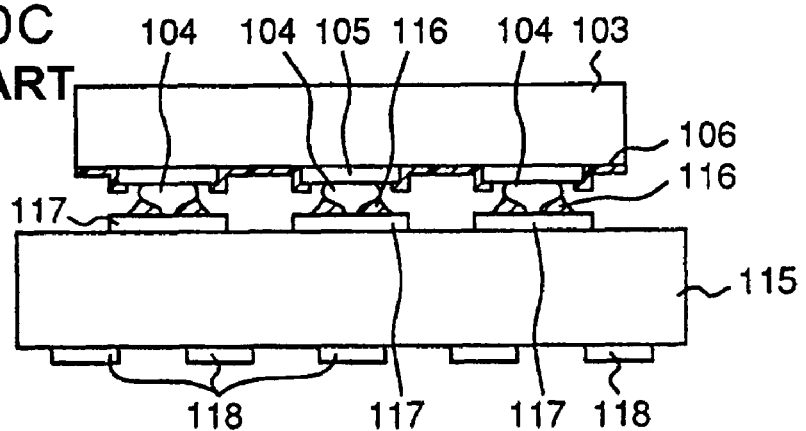
Figure 20D:
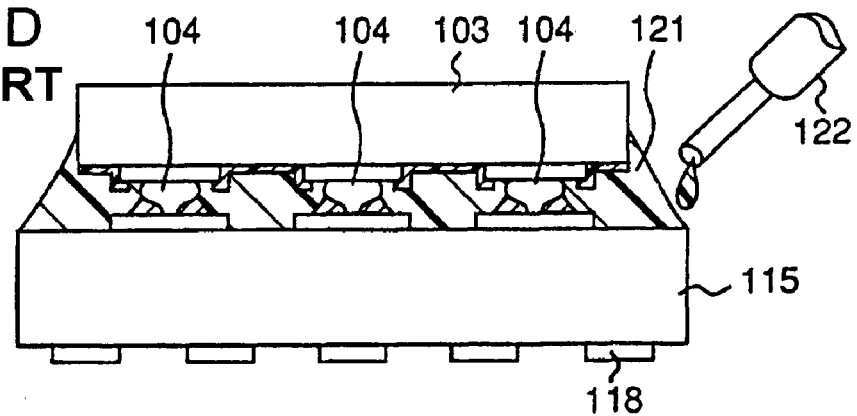

As shown in FIG. 16A, in step S71 of FIG. 17, the reference numeral 23 denotes a film substrate as one example of a thermoplastic resin base material formed of a thermoplastic resin of polyethylene terephthalate, vinyl chloride, polycarbonate, acrylonitrile butadiene styrene, or the like. On the film substrate 23, a circuit pattern is formed of a thermosetting or thermoplastic type conductive paste 22, and a coil 26 is formed for executing data transmission and reception to and from the outside.

Figure 16B:
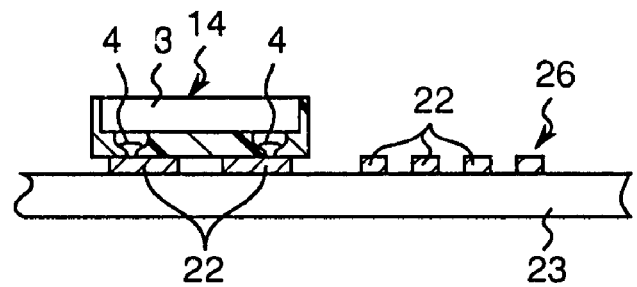

In step S72, as shown in FIG. 16B, a semiconductor package 14 that has an IC chip for use in a noncontact IC card is mounted in a specified position of the circuit pattern, and thereafter, the conductive paste 22 is thermally hardened in step S73.

Figure 16C:
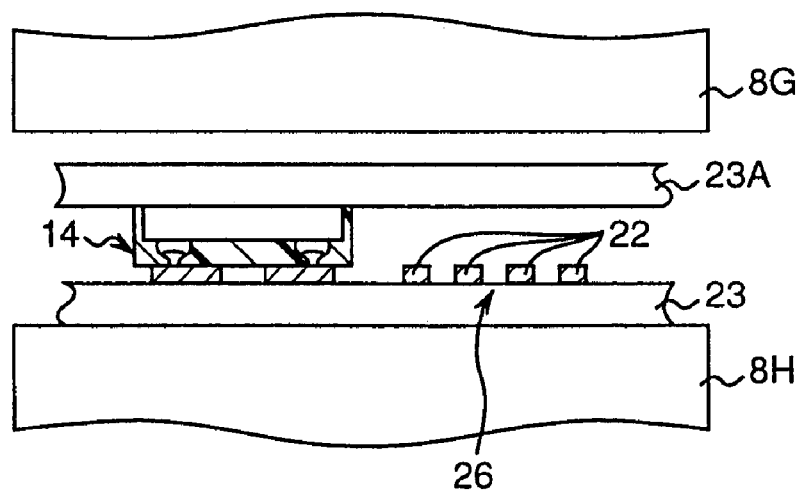
Figure 16D:
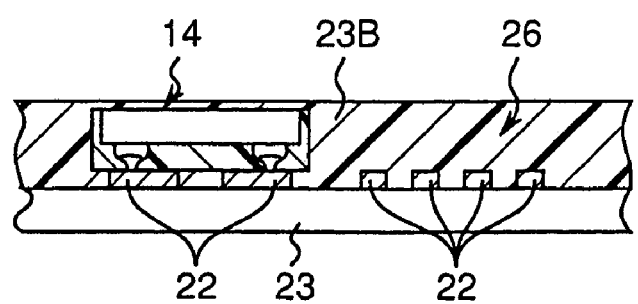

Next, in step S74, as shown in FIG. 16C, the film substrate 23 is placed on a hot pressing plate 8H arranged opposite to a hot pressing plate 8G, and a thermoplastic resin sheet 23A is arranged as a cover sheet on the semiconductor package 14 oppositely to the side of the film substrate 23 on which the circuit board is formed, and the film substrate 23 and the sheet 23A is held between the hot pressing plates 8G and 8H. The thickness of the thermoplastic resin sheet 23A is preferably not smaller than the thickness of the semiconductor device package 14 and is able to be arbitrarily selected according to the required card thickness. For example, in the case of a 0.76-mm thick card conforming to JIS (Japanese Industrial Standard) standard, the thickness of the film substrate 23 is set to 0.2 mm, and the thickness of the thermoplastic resin sheets 23A is set to 0.5 mm. Subsequently, in step S75, by pressurizing the hot pressing plate 8G against the hot pressing plate 8H relatively to each other, hot pressing is carried out to melt the thermoplastic resin sheet 23A, then completely covering the semiconductor device package 14 and the coil 26 and the like located on the side where the circuit board of the film substrate 23 is formed. The melted thermoplastic resin sheet 23A is cooled to constitute a thermoplastic resin portion 23B. Next, in step S76, by cutting the sheet into a card size by punching or the like, the noncontact IC card of the sectional structure shown in FIG. 16D is completed.

According to this seventh embodiment, the casing of the noncontact IC card concurrently serves as the substrate, and therefore, a thin IC card, which has not conventionally existed, can be formed. The conventional structure, in which the semiconductor device has been placed on a glass epoxy substrate or a ceramic substrate and held in the card casing, has been hard to reduce in thickness.

Moreover, since the semiconductor device package can be directly mounted onto the circuit pattern paste formed of the conductive paste prior to the drying of the paste, the productivity is remarkably improved. Conventionally, the process has been complicated and the productivity has been low since the process has included the steps of drying the paste, thereafter mounting the semiconductor device via an anisotropic conductive resin sheet or anisotropic conductive particles, and then performing thermocompression bonding.

Furthermore, by virtue of the needlessness of the material of encapsulant, anisotropic conductive resin sheet or anisotropic conductive particles, a remarkable cost reduction can be achieved. As described above, according to the seventh embodiment, the remarkable improvement of the productivity, cost reduction, and thickness reduction can be achieved in manufacturing the noncontact IC card.

It is to be noted that the present invention is not limited to the aforementioned embodiments and is able to be put into practice in a variety of forms.

As described above, according to the present invention, a thin type semiconductor device package, which has conventionally not existed, can be provided at low cost with high productivity.

Moreover, by employing the semiconductor device package, the electronic component module and the noncontact IC card can be provided at low cost with high productivity.

That is, according to one embodiment of the present invention, there are provided the steps of forming bumps on the element electrodes of a semiconductor device by the wire bonding method, aligning in position a thermoplastic resin sheet with the semiconductor device, forming a thermoplastic resin portion that covers the portion of the semiconductor device except for the end surfaces of the bumps by melting the thermoplastic resin sheet through the hot pressing of the thermoplastic resin sheet and the semiconductor device, and cutting the thermoplastic resin portion after the hot pressing. Therefore, the semiconductor device package, which only has the total thickness of those of the semiconductor device and the thermoplastic resin portion, can be remarkably reduced in thickness, dissimilar to the semiconductor device package shown in the prior art example of FIG. 21. Moreover, because of the absence of the conductive adhesive and the encapsulant shown in FIG. 21 and because of no time required for the hardening of the conductive adhesive and the encapsulant, the productivity can be remarkably improved.

Moreover, according to the electronic component module manufacturing method of the present invention, there are provided the steps of printing a circuit pattern on a first thermoplastic resin sheet by using a conductive paste, mounting the semiconductor device package manufactured by the semiconductor device package manufacturing method together with the electronic component in the specified positions of the circuit pattern of the first thermoplastic resin sheet, aligning in position a second thermoplastic resin sheet with the first thermoplastic resin sheet on which the semiconductor device package and the electronic component are mounted, and melting the second thermoplastic resin sheet through hot pressing, thus forming a thermoplastic resin portion that covers the semiconductor package and the electronic component. Therefore, the electronic component module, which has a thickness almost equal to the total thickness of those of the semiconductor device package and the electronic component, can be reduced in thickness, which cannot be achieved by the electronic component module of the prior art example. Moreover, since the thermoplastic resin portion secures the reliability of the semiconductor device and the electronic component, there is required neither encapsulant nor a time for the hardening of the encapsulant, and this allows the productivity to be remarkably improved. Furthermore, since the material cost is low, an inexpensive electronic component module can be supplied.

Moreover, according to the noncontact IC card manufacturing method of the present invention, there is provided a noncontact IC card that has an IC chip and an antenna coil for executing transmission and reception to and from the outside, through the steps of printing on a thermoplastic resin base material a circuit pattern capable of being electrically connected to the IC electrode portions of the IC chip by a conductive paste or a circuit pattern to be electrically connected to the IC electrode portions that includes a coil pattern constituting the antenna coil, arranging the semiconductor device package on the circuit pattern so that the IC electrode portions of the IC chip of the semiconductor device package that has the IC chip and is manufactured by the semiconductor device package manufacturing method are connected to the circuit pattern, hardening the conductive paste, forming a thermoplastic resin portion for covering the semiconductor device package by positioning a thermoplastic resin sheet on the surface which belongs to the thermoplastic resin base material obtained after the hardening of the conductive paste and on which the semiconductor device package is mounted and by melting the thermoplastic resin sheet through hot pressing, and cutting the thermoplastic resin portion after the hot pressing into a card. Therefore, since the casing of the noncontact IC card concurrently serves as a substrate, a thin type IC card, which has conventionally not existed, can be formed. The conventional structure, in which the semiconductor device has been placed on a glass epoxy substrate or a ceramic substrate and held in the card casing, has been hard to reduce in thickness. Moreover, since the semiconductor device package can be directly mounted onto the circuit pattern paste formed of the conductive paste prior to the drying of the paste, the productivity is remarkably improved. Conventionally, the process has been complicated and the productivity has been low since the process has included the steps of drying the paste, thereafter mounting the semiconductor device via an anisotropic conductive resin sheet or anisotropic conductive particles, and then performing thermocompression bonding. Furthermore, by virtue of the needlessness of the material of encapsulant, anisotropic conductive resin sheet or anisotropic conductive particles, a remarkable cost reduction can be achieved. As described above, according to the seventh embodiment, the remarkable improvement of the productivity, cost reduction, and thickness reduction can be achieved in manufacturing the noncontact IC card.

EIGHTH EMBODIMENT

Next, the eighth embodiment of the present invention is related to a semiconductor component-mounted component manufacturing method and manufacturing apparatus for manufacturing a semiconductor component-mounted component by mounting on a substrate an electronic component such as an IC chip, used for a case of electrically connecting the IC chip to connection pads provided for a circuit pattern constructed of a conductive paste as in the case of manufacturing, for example, a noncontact IC card, a manufacturing method or a manufacturing apparatus for manufacturing a semiconductor component-mounted finished-product that has a semiconductor component-mounted component manufactured by the above manufacturing method or manufacturing apparatus, and a semiconductor component-mounted finished-product manufactured by the semiconductor component-mounted finished-product manufacturing method or manufacturing apparatus.

Before explaining in detail the contents of the eighth embodiment of the present invention, the background thereof will be described first.

The conventional semiconductor component-mounted finished-product manufacturing method will be described below with reference to FIG. 41 through FIG. 48 taking a noncontact IC card as an example.

Conventionally, when manufacturing a noncontact IC card that has built-in coil and IC chip and executes data exchange with the outside via the coil, there have been used a method for using a winding coil made of copper, a method for forming a coil by printing a conductive paste such as silver paste, a method for forming the coil by etching a metal foil such as a copper foil, and the like as a method for forming the coil. Among others, the method for forming the circuit pattern and the coil by printing the conductive paste has used popularity.

FIG. 41 through FIG. 48 show a conventional noncontact IC card and a manufacturing method therefor.

Figure 41:
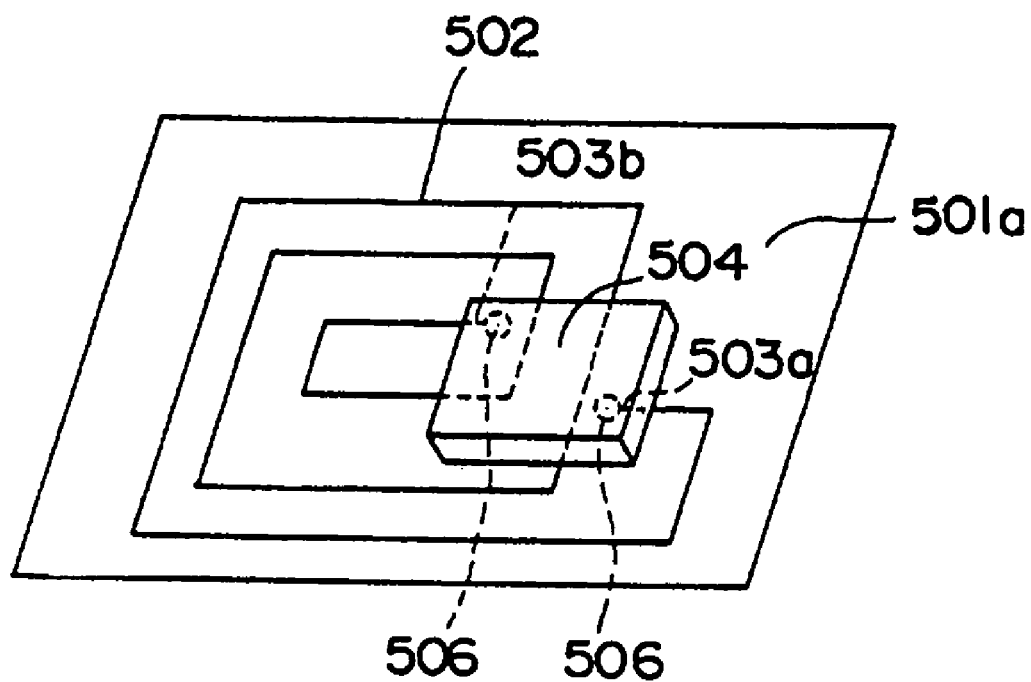
FIG. 41 is a perspective view showing the structure of a conventional noncontact IC card.

As shown in FIG. 41, in the conventional noncontact IC card, a coil pattern 502 is formed of a conductive paste on a first base material 501a, and a connection pad 506 provided at the outer peripheral terminal 503a of this coil pattern 502 and a connection pad 506 provided at the inner peripheral terminal 503b of the coil pattern 2 are electrically connected to the electrode portions of the IC chip 504.

Figure 42:
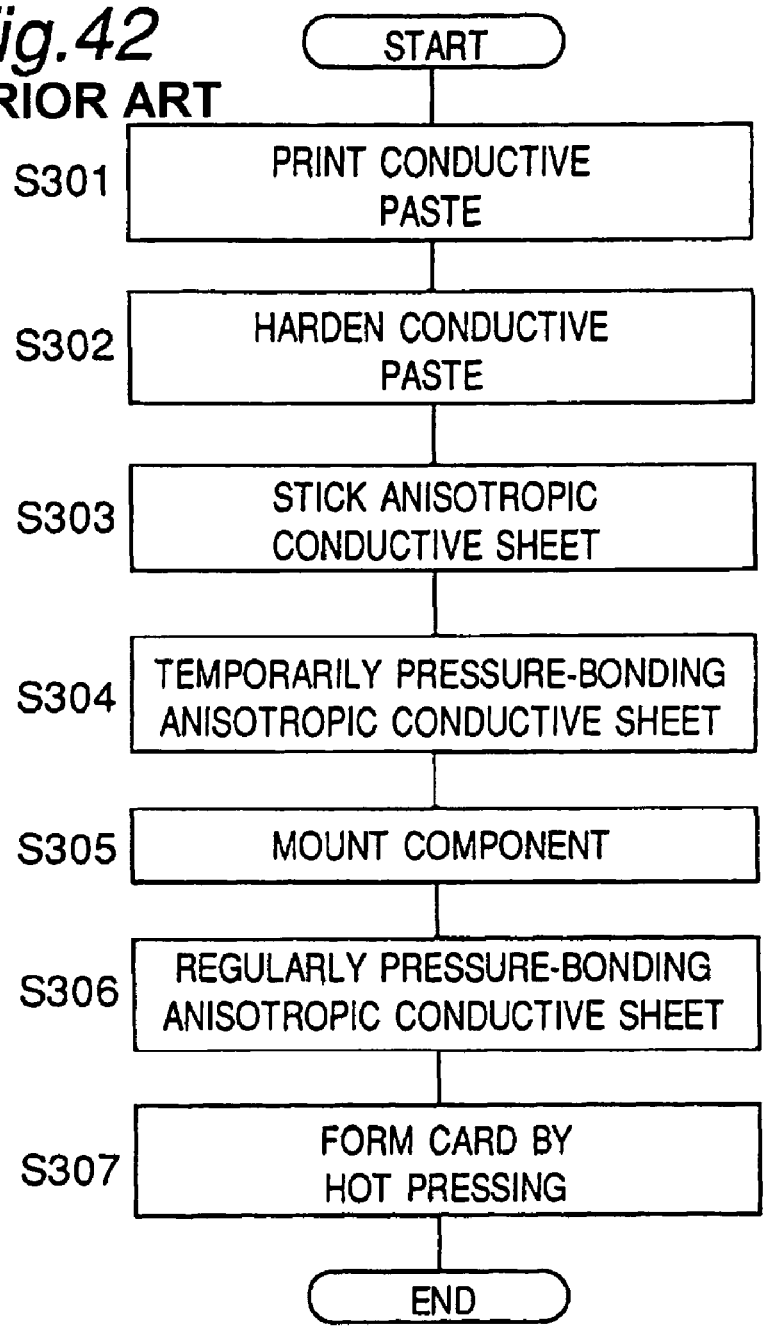
FIG. 42 is a flowchart showing the manufacturing processes of the conventional noncontact IC card.

As shown in FIG. 42, first in step (indicated by "S" in the figure) 301, the manufacturing process thereof has the step of printing a circuit pattern including the coil pattern 502 with a conductive paste on the surface of the first base material 501a. As the above-mentioned conductive paste, silver paste is appropriately used. The printing of the conductive paste is performed by screen printing, offset printing, gravure printing, or the like. For example, in the case of screen printing, a conductive paste is printed on the first base material 501a via a mask of 165 meshes/inch and an emulsion thickness of 10 μm, thus forming a circuit pattern of a conductor thickness of about 30 μm. A thermoplastic resin, which has a thickness of about 0.1 to 0.5 mm and is made of polyethylene terephthalate, vinyl chloride, polycarbonate, acrylonitrile butadiene styrene, or the like, is used for the first base material 501*a* and the second base materials 502*b* described later.

In step S302, the conductive paste is hardened by heating the circuit pattern made of the aforementioned conductive paste formed on the first base material 501*a* by the printing method at a temperature of 120° C. for ten minutes.

Figure 43:
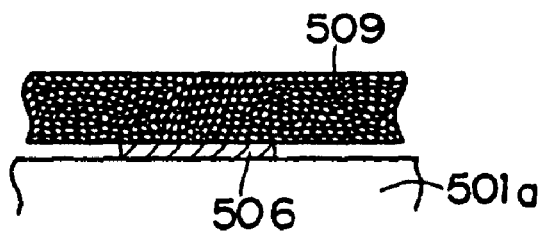
FIG. 43 is a sectional view showing a manufacturing process of the conventional noncontact IC card.

In step 303, as shown in FIG. 43, an anisotropic conductive sheet 509 is stuck to the connection pads 506 provided at the outer peripheral terminal 503*a* and the inner peripheral terminal 503*b* of the circuit pattern. The anisotropic conductive sheet is a resin sheet that contains metallic particles and operates to electrically connect the metallic particles with the connection pads 506 by being heated and pressurized.

In step 304, the anisotropic conductive sheet 509 is heated at a temperature of 100° C. for five seconds so as to be temporarily pressure-bonded to the connection pads 506.

Figure 44:
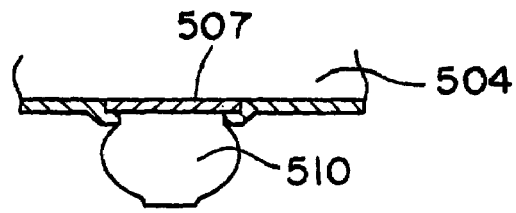
FIG. 44 is a sectional view showing a manufacturing process of the conventional noncontact IC card.
Figure 45:
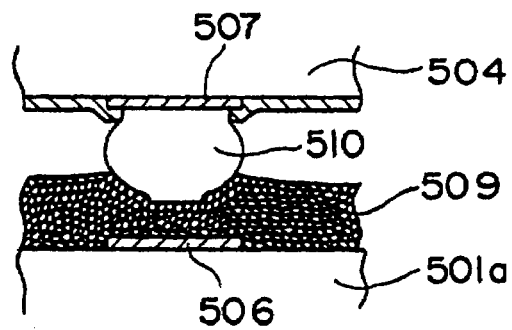
FIG. 45 is a sectional view showing a manufacturing process of the conventional noncontact IC card.

In step S305, a semiconductor device 504 and components of a capacitor and the like are mounted on the temporarily pressure-bonded anisotropic conductive sheet 509. On the mounting surface of the semiconductor device, bumps 510 are formed on electrode pads 507 on the semiconductor device 504 as shown in FIG. 44, and the bumps 510 and the connection pads 506 are electrically connected together via the anisotropic conductive sheet 509 as shown in FIG. 45. It is to be noted that the bump 510 is formed on the electrode pad 507 of the semiconductor device 504 by the wire bonding method or the plating method; or concretely by the plating method which uses solder, gold, silver, copper, or the like.

Figure 46:
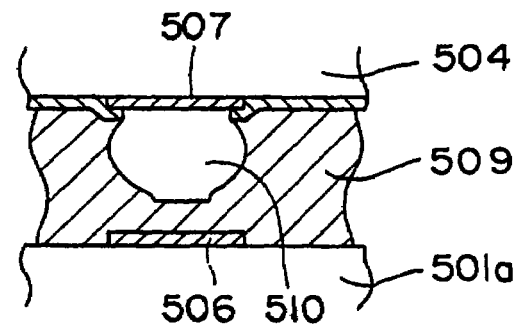
FIG. 46 is a sectional view showing a manufacturing process of the conventional noncontact IC card.

In step 306, the anisotropic conductive sheet is hardened by being heated at a temperature of 200° C. for 30 seconds as shown in FIG. 46, regularly pressure-bonding the semiconductor device 504.

In the general semiconductor mounting employing a glass epoxy substrate or a ceramic substrate for the first base material 501*a*, the mounting of the semiconductor device is completed by this step 306.

Figure 47:
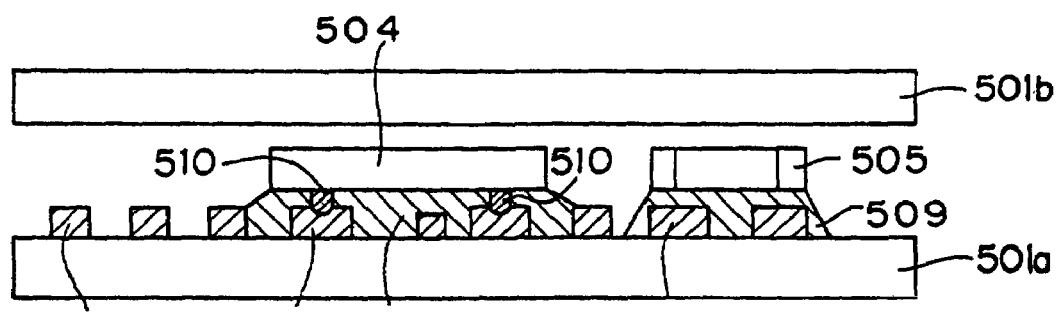
FIG. 47 is a sectional view showing the structure of the conventional noncontact IC card.

Then, in step S307, by sticking the second base material 501*b* to the first base material 501*a* to perform a laminating process, an IC card in which the connection pads 506 and the bumps 510 are electrically connected together via the anisotropic conductive paste 509 is obtained as shown in FIG. 47. In FIG. 47, the reference numeral 505 denotes a capacitor connected parallel to the coil pattern 502.

However, the aforementioned conventional semiconductor component-mounted finished-product manufacturing method and the construction of the noncontact IC card that serves as a semiconductor component-mounted finished-product manufactured by the manufacturing method have had the following issues.

In general, an inexpensive thermoplastic resin such as polyethylene terephthalate and vinyl chloride is used for the first base material 501*a* and the second base material 501*b*. On the other hand, the conventional manufacturing process, which has a high temperature of not lower than 200° C. in regularly pressure-bonding the semiconductor device 504 via the anisotropic conductive sheet 509 in step S306, has the issue that the first base material 501*a* and the second base material 501*b* inferior in terms of heat resistance easily deteriorate.

Moreover, in order to fix the components of the semiconductor device 504 and so on to the first base material 501*a* with the anisotropic conductive sheet 509, there are needed temporary pressure bonding and regular pressure bonding of the anisotropic conductive sheet 509 to the first base material 501*a*. Accordingly, there is an issue that the processes are increased in number and the productivity becomes low, leading to high cost.

The same thing can be said for the case of anisotropic conductive particles used in place of the anisotropic conductive sheet 509.

Figure 48:
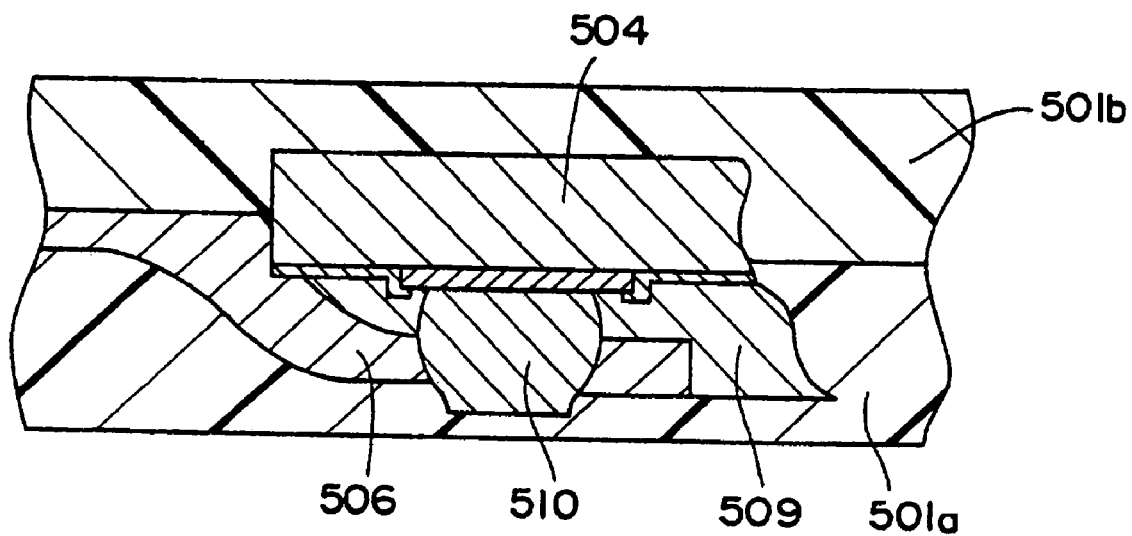
FIG. 48 is a sectional view showing a deficiency state of the conventional noncontact IC card.

Moreover, the semiconductor device 504 is heated and pressurized when performing the laminating process in the step 307. Therefore, as shown in FIG. 48, the semiconductor device 504 sinks in the first base material 501*a*, and the circuit pattern 506 provided by the conductive paste is disadvantageously deformed in a curve. As a result, there is high possibility of circuit pattern disconnection, and a deficiency of operation trouble occurs.

The eighth embodiment of the present invention is intended to solve the above-mentioned issues and has the object of providing a manufacturing method and apparatus of a semiconductor component-mounted component, a manufacturing method and manufacturing apparatus of a semiconductor component-mounted finished-product, and a semiconductor component-mounted finished-product, which have high-quality, high-productivity, and low cost.

The manufacturing method and manufacturing apparatus of the semiconductor component-mounted component, the manufacturing method and manufacturing apparatus of the semiconductor component-mounted finished-product, and the semiconductor component-mounted finished-product of the eighth embodiment of the present invention will be described below with reference to the drawings. In this case, the manufacturing method and manufacturing apparatus of the semiconductor component-mounted finished-product is the manufacturing method and apparatus for manufacturing a semiconductor component-mounted finished-product that has a semiconductor component-mounted component manufactured by the manufacturing method and manufacturing apparatus of the semiconductor component-mounted component, while the semiconductor component-mounted finished-product has the semiconductor component-mounted component manufactured by the manufacturing method and manufacturing apparatus of the semiconductor component-mounted component and is manufactured by the manufacturing method and manufacturing apparatus of the semiconductor component-mounted finished-product. It is to be noted that the same components are denoted by the same reference numerals in each figure.

A first thermoplastic resin base material 422 is taken as one example that fulfills the function of the aforementioned "base material" in the present eighth embodiment, and a bump 413 is taken as one example that fulfills the function of a "circuit connection portion" in the present eighth embodiment. Furthermore, a projecting portion 418, a rugged portion 1131, and an exposed surface 1132 are taken as one example that fulfills the function of a "contact area increasing portion" in the present eighth embodiment. Extension portion-forming members 450, 455 and 457, a heating device 453, and an extension portion-forming member-use pressurizing device 454 are taken as one example that fulfills the function of a "contact area increasing device" in the present eighth embodiment. Moreover, although a noncontact IC card is taken as one example that fulfills the function of the "semiconductor component-mounted finished-product" in the present eighth embodiment, the present invention is, of course, not limited to this.

Figure 22:
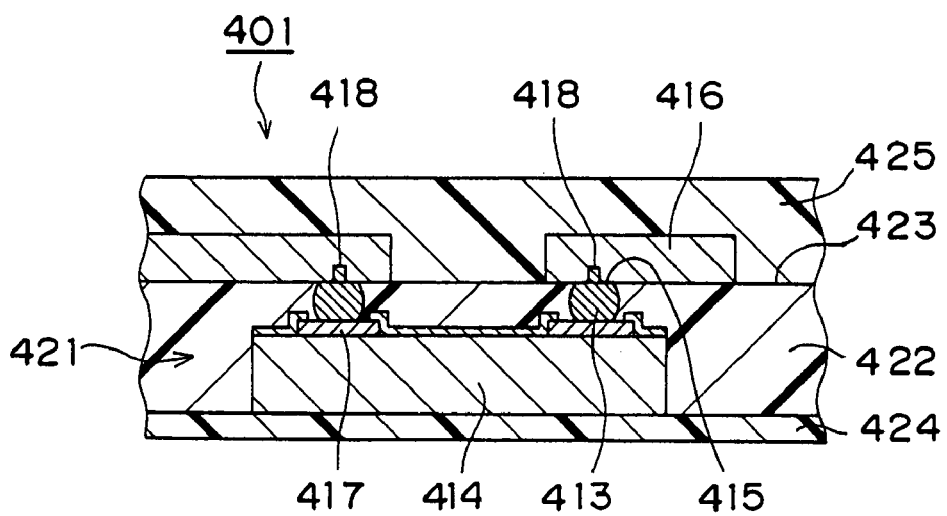
FIG. 22 is a sectional view of a semiconductor component-mounted finished-product according to an eighth embodiment of the present invention.

FIG. 22 shows a noncontact IC card 401 that serves as one example of the semiconductor component-mounted finished-product provided with the semiconductor component-mounted component manufactured by the manufacturing method and manufacturing apparatus of the semiconductor component-mounted component of the present eighth embodiment. In the noncontact IC card 401, a semiconductor device 414 is preparatorily embedded in the first thermoplastic resin base material 422, forming the projecting portions 418 on member forming surfaces 415 that belong to the bumps 413 and are exposed to a pattern forming surface 423 of the first thermoplastic resin base material 422. Then, a circuit pattern 416 formed of a conductive paste and the projecting portions 418 directly obtain conduction without interposition of an anisotropic conductive paste or the like, dissimilar to the prior art example. The reference numerals 424 and 425 denote a second thermoplastic resin sheet base material and a third thermoplastic resin sheet base material for performing laminating process to protect a semiconductor component-mounted component 421 that has the semiconductor device 414 and the circuit pattern 416 and are used for the laminating process corresponding to the encapsulating operation of the semiconductor component-mounted component 421 by the encapsulating devices 426 and 427. The manufacturing procedure of the noncontact IC card 401 will be described below with reference to FIG. 23 through FIG. 29 and FIG. 36.

Figure 23:
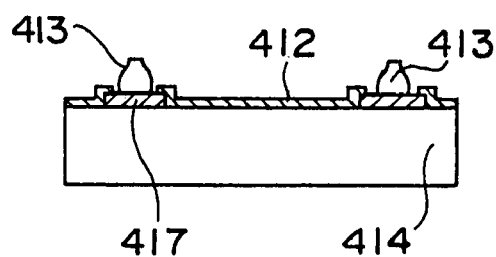
FIG. 23 is a view for explaining a manufacturing process of the semiconductor component-mounted finished-product shown in FIG. 22, showing a state in step 201.

In FIG. 23, the reference numeral 417 denotes the electrode of the semiconductor devices 414 corresponding to a semiconductor component, while the reference numeral 412 denotes a passivation film for protecting the active surface of the semiconductor device 414.

Figure 36:
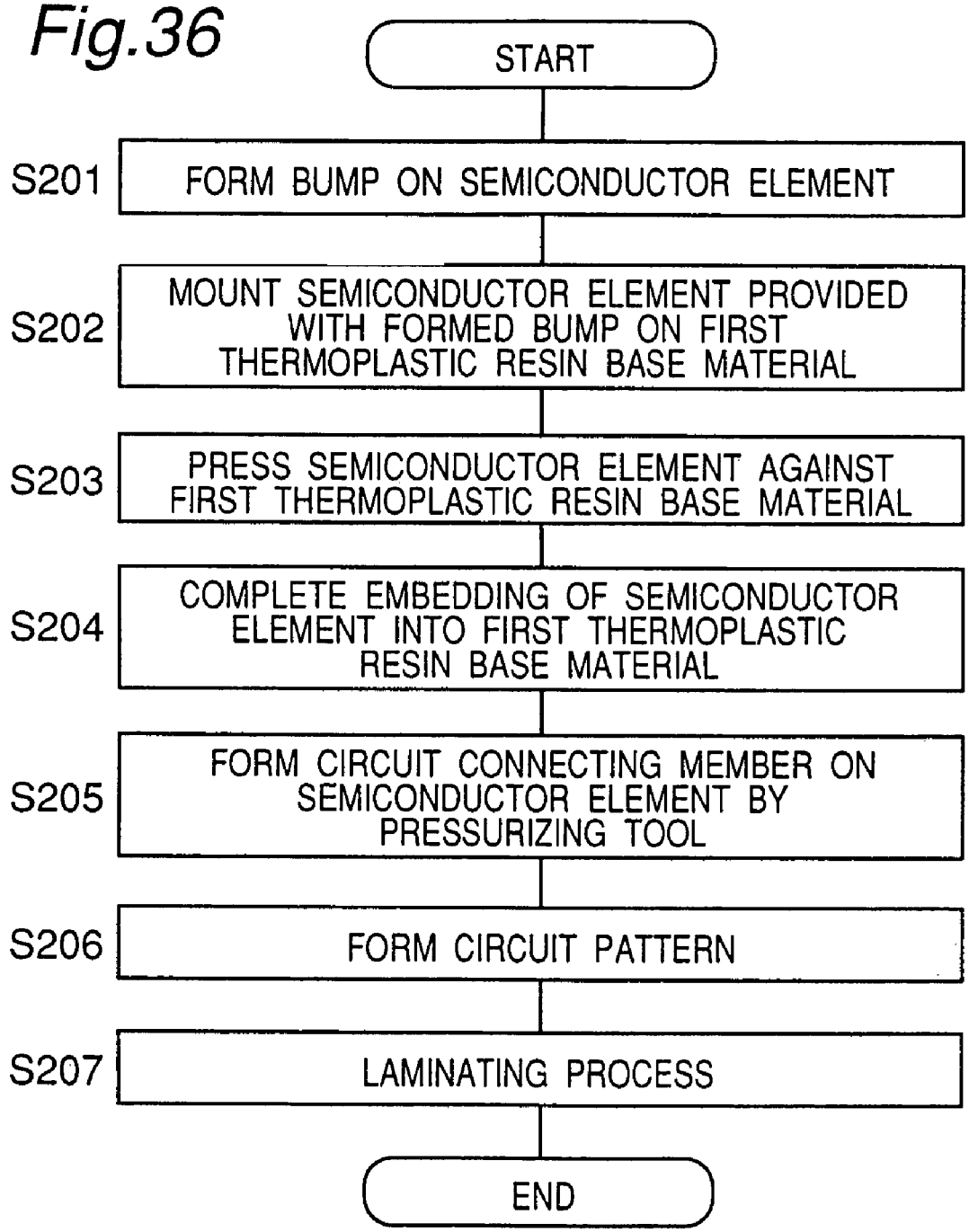
FIG. 36 is a flowchart showing the manufacturing processes of the semiconductor component-mounted finished-product shown in FIG. 22.

In step (indicated by "S" in FIG. 36) 201 shown in FIG. 23 and FIG. 36, the bumps 413 are formed on electrodes 417 of the semiconductor device 414 by the wire bonding method which uses a metallic wire made of Au, Cu, solder, or the like.

Figure 24:
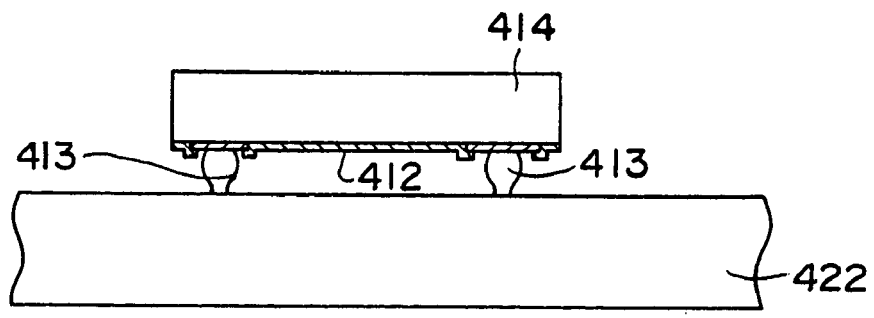
FIG. 24 is a view for explaining a manufacturing process of the semiconductor component-mounted finished-product shown in FIG. 22, showing a state in step 202.

Next, in step S202 shown in FIG. 24 and FIG. 36, one or a plurality of semiconductor devices 414 on which the bumps 413 are formed are mounted on a sheet-shaped first thermoplastic resin base material 422 formed of a thermoplastic resin of polyethylene terephthalate, vinyl chloride, polycarbonate, acrylonitrile butadiene styrene, or the like, which has an electrical insulating property. In this case of the eighth embodiment, the thickness of the first thermoplastic resin base material 422 is preferably basically greater than the thickness of the semiconductor device 414 and not greater than the total thickness of the thickness of the semiconductor device 414 and the height of the bump 413 for the reason that at least the member forming surfaces 415 of the bumps 413 are required to be exposed from the first thermoplastic resin base material 422, as described later. For example, when the semiconductor device 414 has a thickness of 0.18 mm and the bump 413 has a height of 0.04 mm, the first thermoplastic resin base material 422 preferably has a thickness of 0.2 mm.

Figure 25:
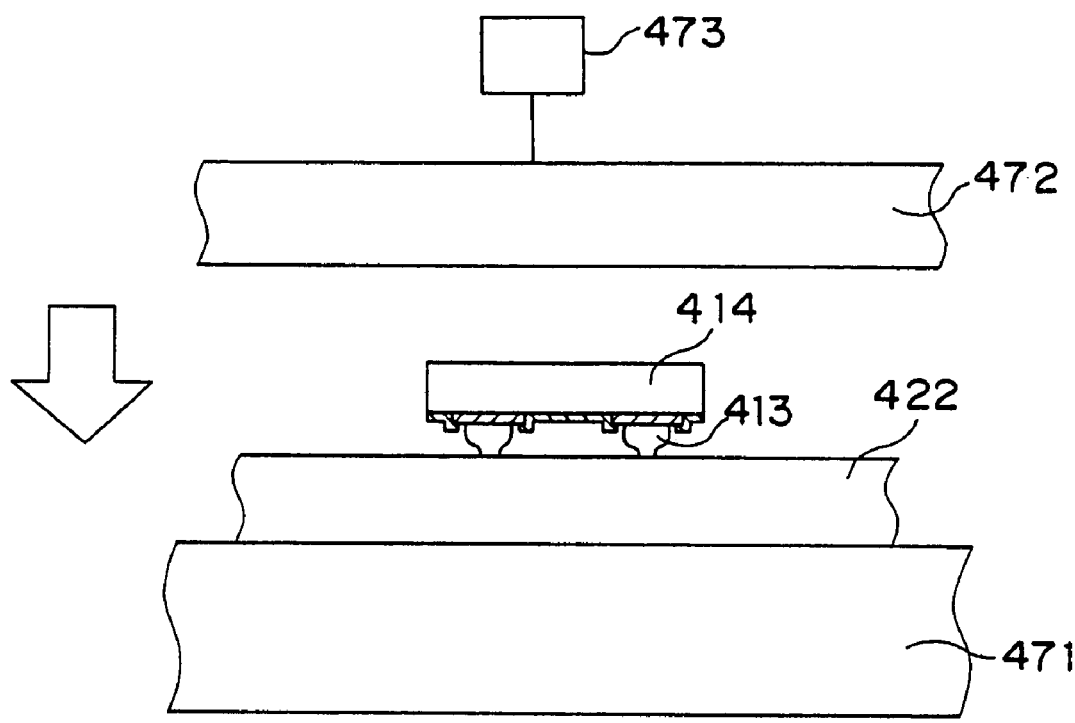
FIG. 25 is a view for explaining a manufacturing process of the semiconductor component-mounted finished-product shown in FIG. 22, showing a state in step 203.

Next, in step 203 shown in FIG. 25 and FIG. 36, the first thermoplastic resin base material 422 on which the semiconductor device 414 provided with the bumps 413 is mounted is held between hot pressing plates 471 and 472, and the semiconductor device 414 provided with the bumps 413 and the first thermoplastic resin base material 422 are pressurized relative to each other by a semiconductor part pressurizing device 473 with heat applied to them, inserting the semiconductor device 414 into the first thermoplastic resin base material 422. When a first thermoplastic resin base material made of, for example, polyethylene terephthalate is employed, the hot pressing conditions include a pressure of 30 105 Pa, a temperature of 120 C, and a pressing time of one minute. The temperature and the pressure are varied according to the material of the first thermoplastic resin base material 422.

Figure 26:
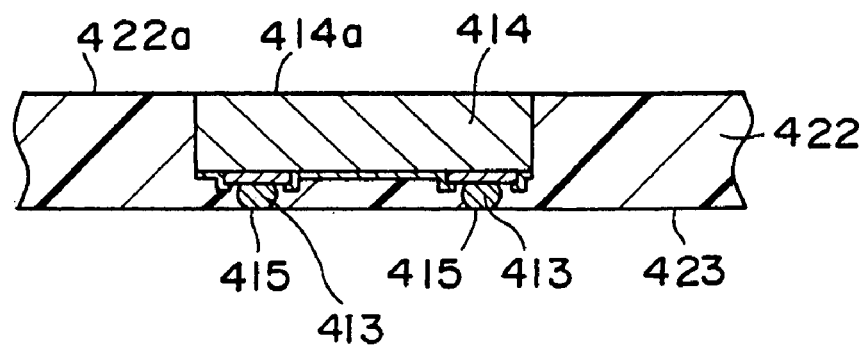
FIG. 26 is a view for explaining a manufacturing process of the semiconductor component-mounted finished-product shown in FIG. 22, showing a state in step 204.

FIG. 26 corresponding to step 204 is a sectional view showing the state of the semiconductor device 414 and the first thermoplastic resin base material 422 obtained after the pressing. By the operation of inserting the semiconductor device 414 into the first thermoplastic resin base material 422, in the present eighth embodiment, as shown in FIG. 26, the semiconductor device 414 and the bumps 413 are embedded in the first thermoplastic resin base material in a state in which the end surfaces of the bumps 413, i.e., the member forming surfaces 415 that are surfaces on which the bumps 413 are brought in contact with the hot pressing plate 471 is exposed to the pattern forming surface 423 of the first thermoplastic resin base material 422 by the aforementioned pressing.

At this time, in the present eighth embodiment, for decreasing its thickness, it is constructed so that a back surface 414*a* opposite from the active surface of the semiconductor device 414 and a back surface 422*a* of the first thermoplastic resin base material 422 opposite from the pattern forming surface are flush with each other as shown in the figure. However, the present invention is not limited to this. That is, depending on the semiconductor component-mounted component to be manufactured, it is acceptable to make the back surface 414*a* of the semiconductor device 414 project from, for example, the back surface 422*a* of the first thermoplastic resin base material 422 by adjusting the thickness of the first thermoplastic resin base material 422, the pressurization force of the hot pressing plates 471 and 472, or the like.

Figure 38:
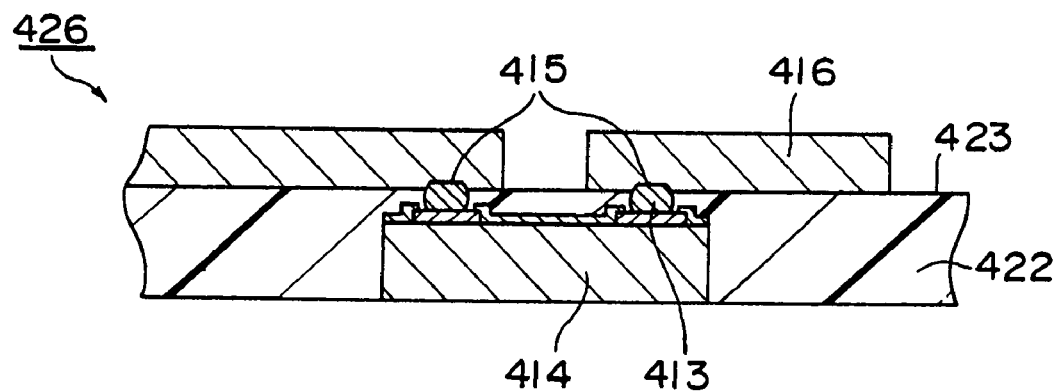
FIG. 38 is a sectional view of a modification example of the semiconductor component-mounted finished-product shown in FIG. 28.

It is to be noted that the member forming surface 415 is one example for fulfilling the function of the electric connection surface. Moreover, in the present eighth embodiment, only the member forming surfaces 415 are exposed from the pattern forming surface 423 of the first thermoplastic resin base material 422. However, by devising the shape of, for example, the pressing plate 471, it is acceptable to expose not only the member forming surfaces 415 but also parts or the wholes of the bumps 413 from the pattern forming surface 423. If this construction is adopted, the electrical connection surface corresponds to the external surface of the portion exposed from the pattern forming surface 423. It is to be noted that FIG. 38 shows a case in which the member forming surfaces 415 of the bumps 413 and their peripheral portions are exposed from the pattern forming surface 423.

Figure 27:
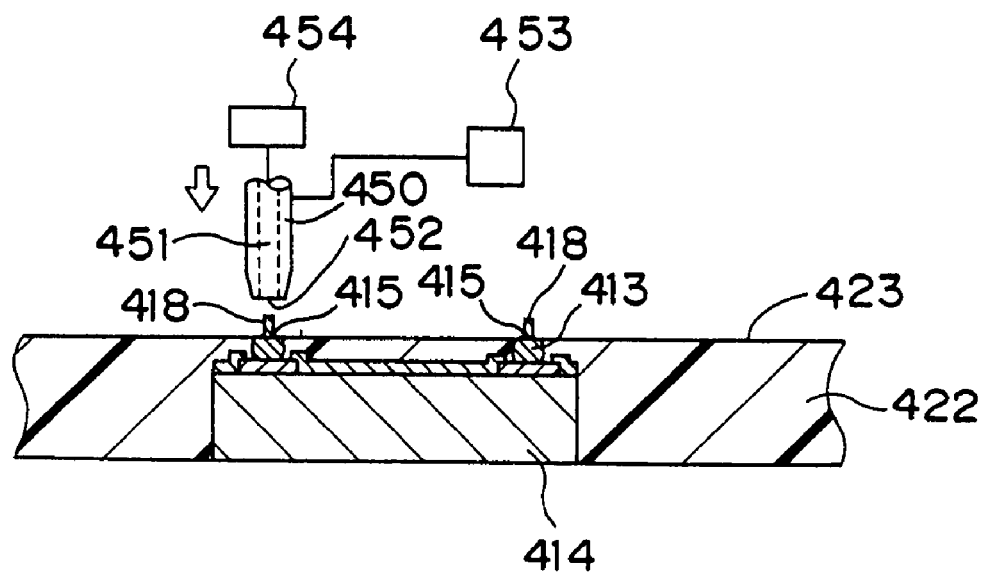
FIG. 27 is a view for explaining a manufacturing process of the semiconductor component-mounted finished-product shown in FIG. 22, showing a state in step 205.

Next, in step 205 of FIG. 27 and FIG. 36, by pressurizing the member forming surfaces 415 of the bumps 413 exposed on the pattern forming surface 423 of the first thermoplastic resin base material 422 by an extension portion-forming member 450, the projecting portions 418 are formed integrally with the bumps 413 from the bumps 413 on the member forming surfaces 415.

That is, for example, a cylindrical structure that internally has a hollow portion 451 is employed as the extension portion-forming member 450. By heating the extension portion-forming member 450 to a temperature of, for example, 200 C by means of a heating device 453 connected to the extension portion-forming member 450 and pressurizing the tip 452 of the extension portion-forming members 450 against the member forming surfaces 415 with a load of 100 g per bump by means of the extension portion-forming member-use pressurizing device 454, the member forming surfaces 415 are deformed, and parts of the bumps 413 enter a hollow portion 451. Therefore, after the pressurization, rectangularly projecting portions 418 projecting from the member forming surfaces 415 are formed integrally with the bumps 413 on the member forming surfaces 415.

By forming the projecting portions 418 as described above, a contact area with the circuit pattern of a conductive paste described later is increased further than when the circuit pattern is formed on the member forming surfaces 415, and therefore, the reliability of bonding is increased. Moreover, since the projecting portions 418 are formed by the extension portion-forming members 450, further cost reduction can be achieved than when bumps are further formed on, for example, the bumps 413.

Figure 39:
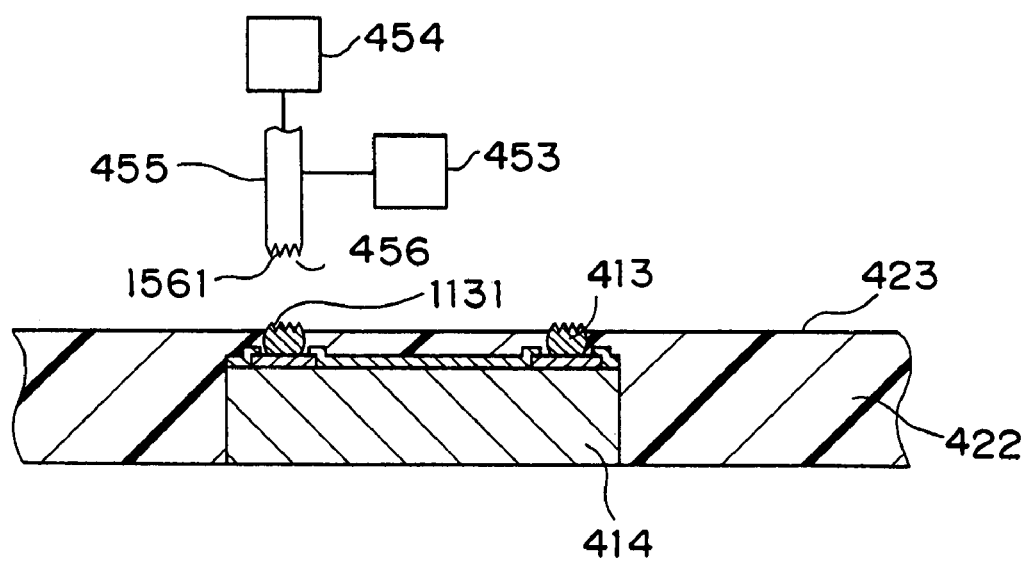
FIG. 39 is a view showing a modification example of an extension portion-forming member shown in FIG. 27.

Moreover, the extension portion-forming member 450 is not limited in shape to the above-mentioned one and is also able to be provided by one whose tip 456 is preferably sharpened or preferably provided with a plurality of rugged portions 1561 as, for example, a rod-shaped extension portion-forming member 455 as shown in FIG. 39. By pressurizing the rugged portions 1561 of the extension portion-forming member 455 as described above against the member forming surfaces 415 of the bumps 413, the rugged portions 1131 can be formed on the member forming surfaces 415, and the contact area of the circuit pattern of the conductive paste described later with the bumps 413 can be increased, allowing the reliability of bonding to be increased.

Figure 40:
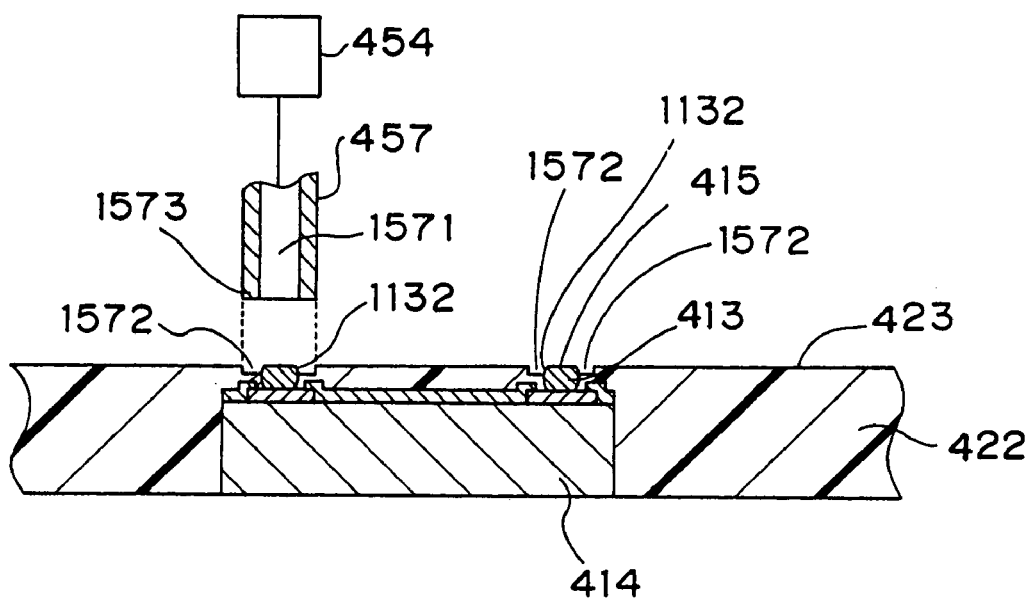
FIG. 40 is a view showing another modification example of the extension portion-forming member shown in FIG. 27.

Furthermore, as a modification example of the extension portion-forming member 450, an extension portion-forming member 457 as shown in FIG. 40 can also be employed. The extension portion-forming member 457 has a hollow portion 1571 that has a capacity for accommodating therein the bumps 413 and a tip portion 1573 that forms contact area increasing grooves 1572 for increasing the contact area of the circuit pattern of the conductive paste described later with the bump 413, around the bumps 413 when the tip portion of the extension portion-forming member 457 is pressurized against the pattern forming surface 423 of the first thermoplastic resin base material 422. By pressurizing the extension portion-forming member 457 described above against the pattern forming surface 423 of the first thermoplastic resin base material 422, the contact area increasing grooves 1572 are formed around the bumps 413, and an exposed surface 1132 exposed from the first thermoplastic resin base material 422 is formed by the contact area increasing groove 1572. Therefore, the surface areas of the bumps 413 exposed from the pattern forming surface 423 can be increased, and the contact area of the circuit pattern of the conductive paste described later with the bumps 413 can be increased, allowing the reliability of bonding to be increased.

That is, the extension portion-forming member which forms the contact area increasing portion for increasing the contact area of the circuit pattern of the conductive paste described later with the bumps 413 can be used for the bumps 413. In this case, the projecting portion 418, the rugged portion 1131 formed on the member forming surface 415 by the rugged portion 1561, and the exposed surface 1132 exposed by the contact area increasing groove 1572 correspondingly serve as the contact area increasing portion. Moreover, when the rugged portion 1131 is formed on the bump, it is acceptable to form a rugged portion on the bump by a hot pressing plate provided with a rugged surface by utilizing the time of embedding of the semiconductor device 414 in the hot pressing plate 471 in step 203.

Figure 28:
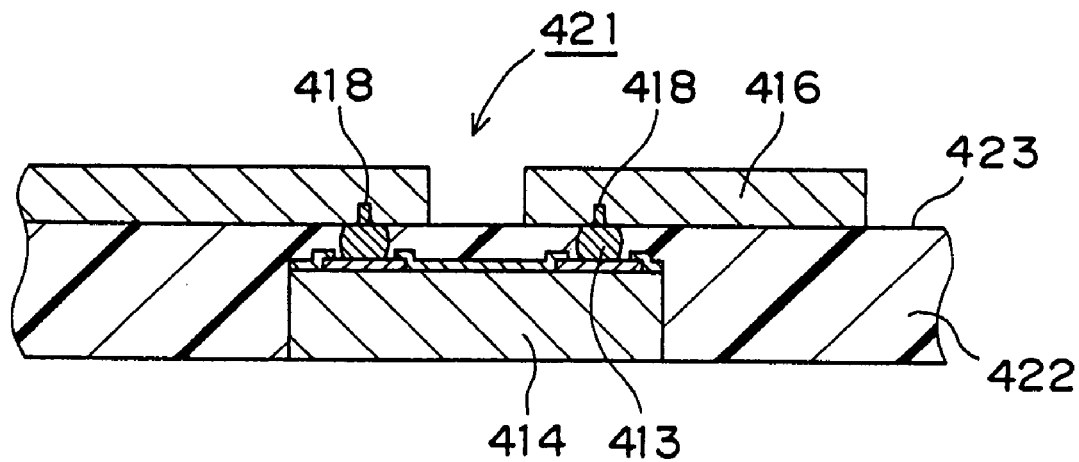
FIG. 28 is a view for explaining a manufacturing process of the semiconductor component-mounted finished-product shown in FIG. 22, showing a state in step 206.

Next, in step 206 of FIG. 28 and FIG. 36, the circuit pattern 416 electrically connected to the semiconductor device 414 is formed on the pattern forming surface 423 of the first thermoplastic resin base material 422 so as to make contact with the projecting portion 418 using a conductive paste of Ag, Cu, or the like or preferably so as to embed the projecting portion 418 as shown in the figure. Moreover, even in the case of the aforementioned rugged portion 1131 and the exposed surface 1132 of the bump 413, the circuit pattern 416 to be electrically connected to the semiconductor device 414 is formed on the pattern forming surface 423 of the first thermoplastic resin base material 422 so as to make contact with the rugged portion 1131 and the exposed surface 1132 or preferably so as to embed them.

The formation of the circuit pattern 416 of the conductive paste is generally performed by the screen printing, offset printing, gravure printing, or the like. For example, in the case of the screen printing, a conductive paste is printed via a mask of 165 meshes/inch and an emulsion thickness of 10 μm, thus forming a circuit pattern 416 of a conductor thickness of about 30 μm. It is to be noted that the circuit pattern 416 formed in the present eighth embodiment has the shape of an antenna coil for executing transmission and reception of information to and from the semiconductor device 414 in a wireless manner. The circuit pattern 416 is, of course, not limited to the aforementioned antenna coil shape and can be formed into a form corresponding to the functions of the semiconductor component-mounted component as a manufactured product.

The semiconductor device 414 is thus mounted on the circuit pattern 416. Moreover, the constituent part in the mounted state shown in FIG. 28 is served as a semiconductor component-mounted component 421.

Figure 29:
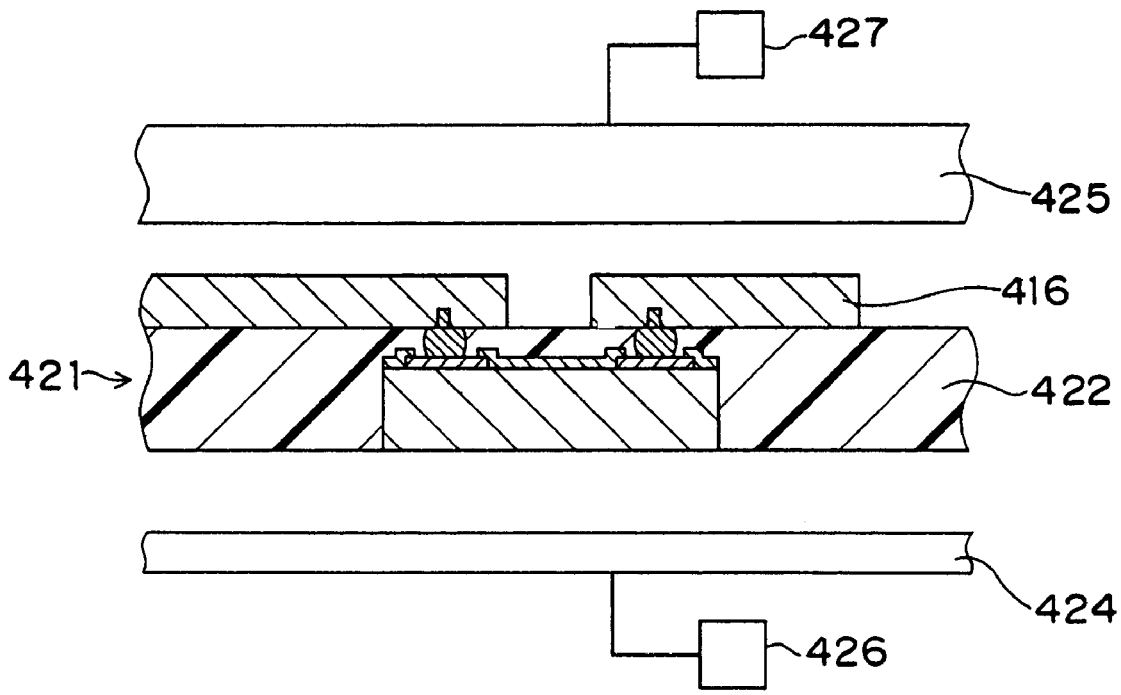
FIG. 29 is a view for explaining a manufacturing process of the semiconductor component-mounted finished-product shown in FIG. 22, showing a state in step 207.

Next, in step S207 of FIG. 29 and FIG. 36, the semiconductor component-mounted component 421 is sandwiched in the direction of thickness thereof between the second thermoplastic resin sheet base material 424 and the third thermoplastic resin sheet base material 425, which have a sheet-like shape and electrical insulating properties and are made of polyethylene terephthalate, vinyl chloride, polycarbonate, acrylonitrile butadiene styrene, or the like and then laminated by encapsulating devices 426 and 427, thus performing the encapsulation of the semiconductor component 421. For example, when the first thermoplastic resin base material made of polyethylene terephthalate is employed, the laminating process conditions include a pressure of $30 \times 10^5$ Pa, a temperature of 120° C., a pressing time of one minute, and a pressure retention time of one minute.

Through the aforementioned processes, the semiconductor component-mounted component that serves as a module on which the semiconductor device 414 is mounted as shown in FIG. 22, and the noncontact IC card 401 corresponding to one example that fulfills the functions as a semiconductor component-mounted finished-product having the semiconductor component-mounted component as in the case of the present eighth embodiment is completed.

As described above, according to the present eighth embodiment, the semiconductor device 414 is embedded in the first thermoplastic resin base material 422, and thereafter, they are formed into a card. Therefore, the sinking of the semiconductor device 504 into the base material 501*a* after the formation of a card, as in the prior art example shown in FIG. 48, does not occur.

Therefore, the circuit pattern 416 is not disconnected, and this enables the manufacturing of high-quality semiconductor component-mounted component and semiconductor component-mounted finished-product.

Furthermore, since there is no need for using a bonding material such as an anisotropic conductive sheet or anisotropic conductive particles, there is no process required for the processing of the anisotropic conductive sheet or the like, and this enables the provision of high-productivity inexpensive semiconductor component-mounted component and semiconductor component-mounted finished-product.

Figure 30:
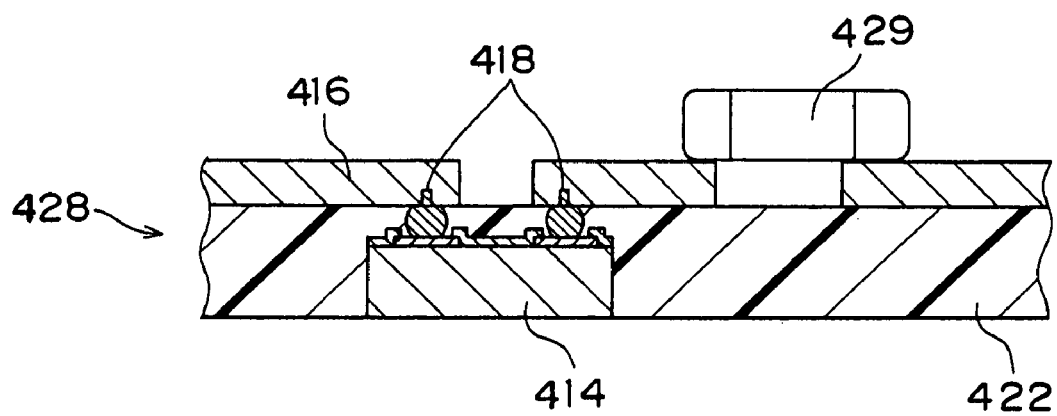
FIG. 30 is a view showing a state in which the electronic component is mounted on the circuit pattern in the semiconductor component-mounted component provided for the semiconductor component-mounted finished-product shown in FIG. 22.
Figure 31:
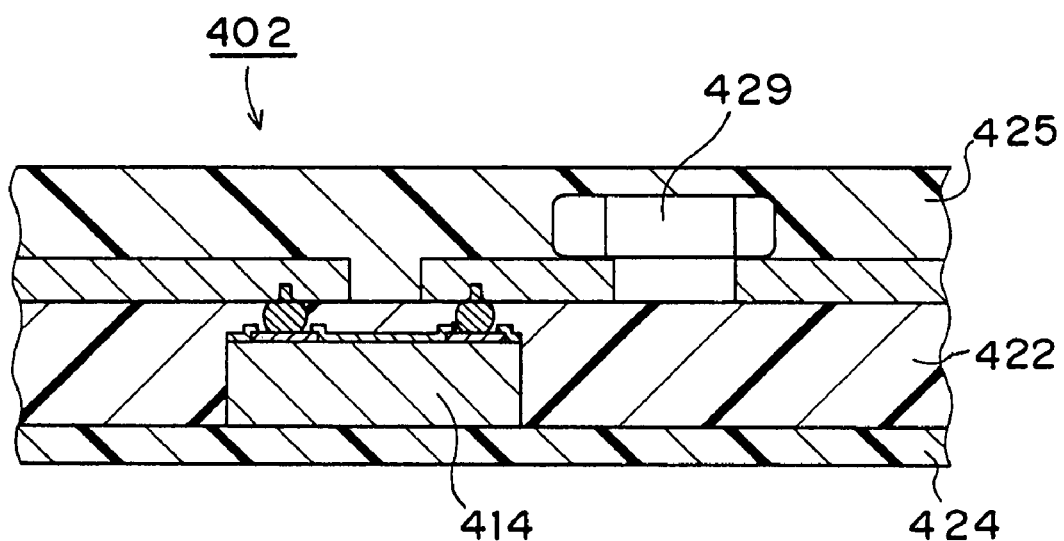
FIG. 31 is a sectional view showing a state in which the semiconductor component-mounted component shown in FIG. 30 is subjected to a laminating process.

Moreover, it is also possible to form a semiconductor component-mounted component 428 in which the circuit pattern 416 is formed on the pattern forming surface 423 in step 206 and thereafter, as shown in FIG. 30, an electronic component 429 that serves as a passive component of a capacitor, a resistor, or the like is mounted in a specified position of the circuit pattern. Then, as shown in FIG. 31, it is also possible to manufacture the noncontact IC card 402 as shown in FIG. 31 by sandwiching the semiconductor component-mounted component 428 in the direction of thickness thereof between the second thermoplastic resin base material 424 and the third thermoplastic resin base material 425 and then performing the laminating process.

Figure 32:
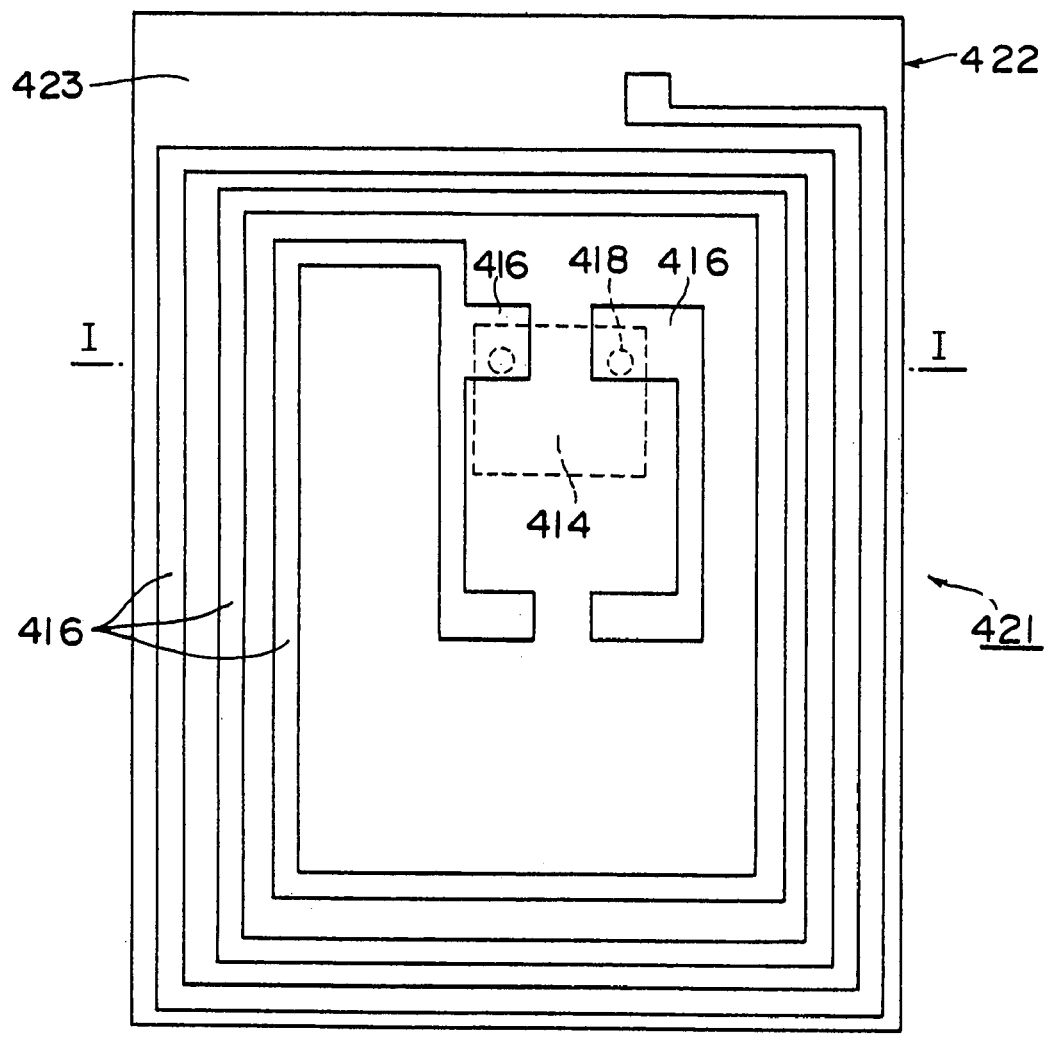
FIG. 32 is a plan view of a semiconductor component-mounted component provided for a noncontact IC card in a case where the semiconductor component-mounted finished-product shown in FIG. 22 is the noncontact IC card.
Figure 33:
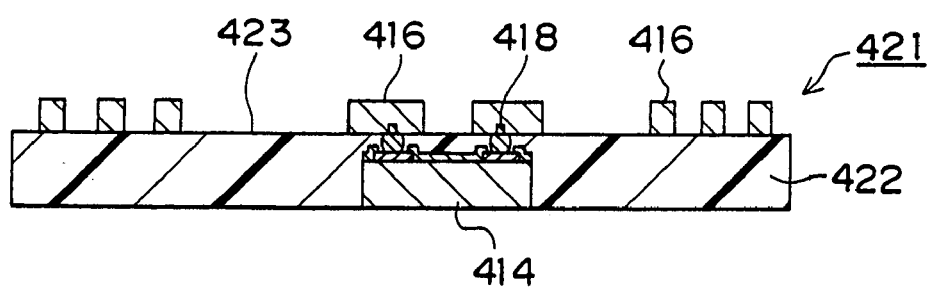
FIG. 33 is a sectional view taken along the line I—I shown in FIG. 32.
Figure 34:
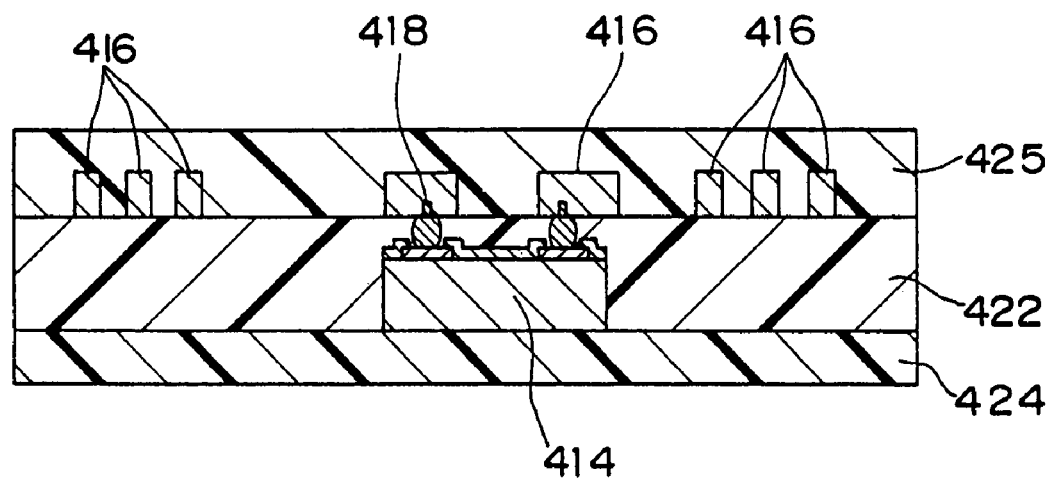
FIG. 34 is a sectional view taken along the line I—I of the noncontact IC card shown in FIG. 32.

Only the connection portions of the semiconductor device 414 and the circuit pattern 416 are shown in FIG. 22 through FIG. 31 described hereinabove. FIG. 32 shows a plan view showing the whole of the semiconductor component-mounted component 421 shown in FIG. 28. FIG. 33 shows a sectional view taken along the line I—I shown in FIG. 32. FIG. 34 shows a sectional view taken along the line I—I of the noncontact type IC card 401 obtained through the laminating process of the whole of the semiconductor component-mounted component 421 with the second thermoplastic resin sheet base material 424 and the third thermoplastic resin sheet base material 425.

Figure 35:
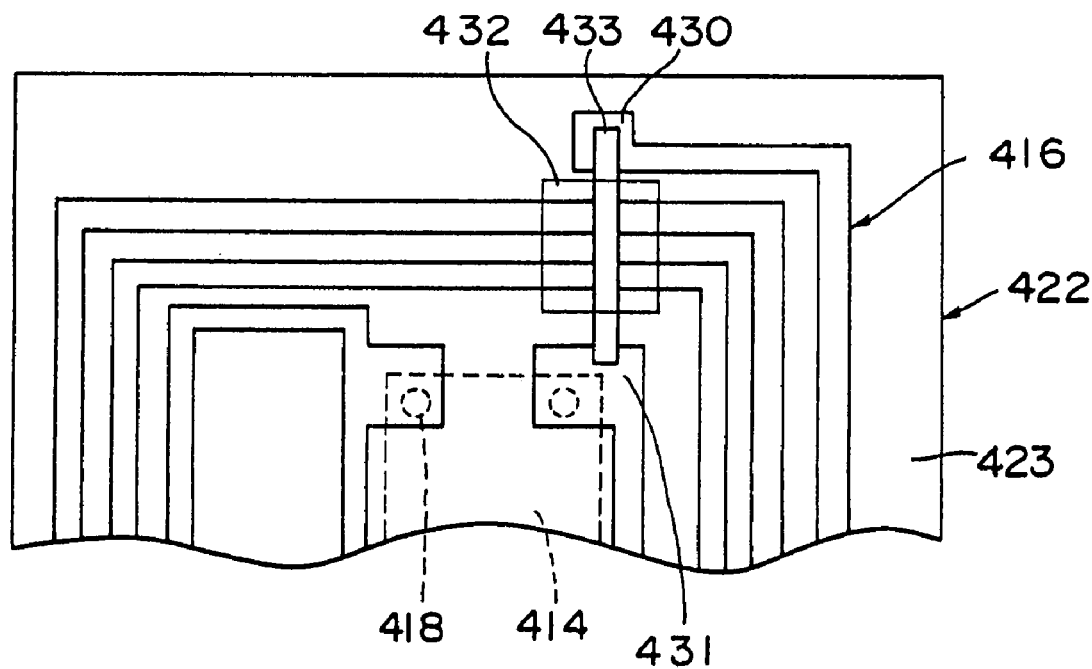
FIG. 35 is a plan view showing a state in which the noncontact IC card of FIG. 32 is provided with a jumper.

Moreover, as shown in FIG. 35, an insulating film 432 is provided for the circuit pattern 416 in order to jumper-connect an outer peripheral terminal 430 of the circuit pattern 416 with the corresponding portion 431 of the electrode 417 of the semiconductor device 414, and thereafter, the outer peripheral terminal 430 and the electrode corresponding portion 431 are electrically connected with each other by the printing of a conductive paste, a conductive foil 433, or the like. With this arrangement, a jumper as shown in the figure is completed. It is to be noted that the formation of the insulating film 432 is performed by the bonding of a polyester-based insulating foil or the printing of an insulating coating.

Figure 37:
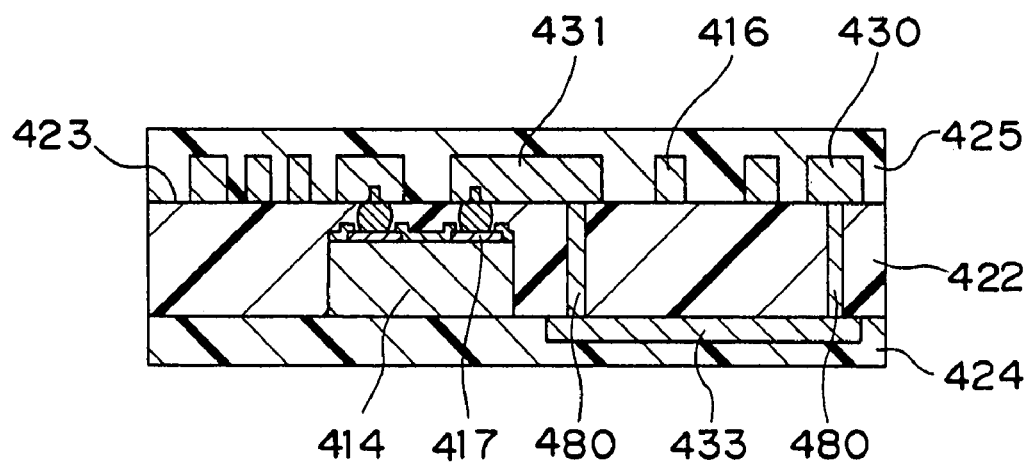
FIG. 37 is a sectional view of a modification example of the noncontact IC card shown in FIG. 32 provided with a jumper.

Moreover, the jumper connection of the outer peripheral terminal 430 of the circuit pattern 416 with the corresponding portion 431 of the electrode 417 of the semiconductor device 414 is not limited to the aforementioned method and is also able to be achieved by forming a circuit pattern 433 on the opposite side of the surface on which the circuit pattern 416 is formed by printing a conductive paste via a through hall 480 preparatorily provided in the first thermoplastic resin base material 422 as shown in, for example, FIG. 37. The formation of the circuit pattern 433 may be performed before the embedding of the semiconductor device 414 in the first thermoplastic resin base material 422 or after the formation of the circuit pattern 416. The through hall 480 can be filled with the conductive paste concurrently with the printing of the circuit pattern 416 or the printing of the circuit pattern 433.

Moreover, although the pattern 433 formed on the opposite side of the surface on which the circuit pattern 416 is formed is the coil jumper in the present eighth embodiment, the present invention is not limited to the construction. It is enabled to form the first thermoplastic resin base material 422 into a double-sided substrate and form the same into a form corresponding to the functions of the semiconductor component-mounted component that serves as a manufactured product.

According to the above description, although the semiconductor component-mounted component 421 or the semiconductor component-mounted component 428 are sandwiched between the two thermoplastic resin sheet base materials 424 and 425 when manufacturing the noncontact IC card as one example that fulfills the functions of a semiconductor component-mounted finished-product, the present invention is not limited to the construction. For example, when the first thermoplastic resin base material 422 is placed on a plate and encapsulated, it is proper to employ only the third thermoplastic resin base material only 425, and it is proper to appropriately devise the use of the two thermoplastic resin base materials 424 and 425 according to the type and functions of the semiconductor component-mounted component to be manufactured.

Moreover, although the operation of inserting the semiconductor device 414 provided with the bumps 413 into the first thermoplastic resin base material 422 and the operation of exposing the member forming surfaces 415 of the bumps 413 on the pattern forming surface 423 are processed in the same process in step S203 by executing the thickness adjustment of the first thermoplastic resin base material 422 and control of the hot pressing operation as described above in the eighth embodiment, the present invention is not limited to this. That is, it is acceptable to expose, for example, the member forming surfaces 415 as projecting portions 418 by the extension portion-forming member 450 in the step 206 for the achievement of electrical connection to the circuit pattern 416 without exposing the member forming surfaces 415 on the pattern forming surface 423.

As described in detail above, according to the manufacturing method and manufacturing apparatus of the semiconductor component-mounted component, the manufacturing method and manufacturing apparatus of the semiconductor component-mounted finished-product of the present invention and the semiconductor component-mounted finished-product of the third aspect, the mounting is completed by forming the contact area increasing portion by the contact area increasing device on the circuit connection portion of the inserted semiconductor component after the insertion of the semiconductor component into the base material by the semiconductor component pressurizing device, and then forming the circuit pattern on the circuit connection portion that has the contact area increasing portion. Therefore, because neither the anisotropic conductive sheet nor the anisotropic conductive particles is used during mounting, remarkable improvement of the productivity and cost reduction can be achieved in comparison with the conventional case. Moreover, since the circuit pattern is formed on the semiconductor component inserted in the base material, the sinking of the semiconductor component, which has occurred in the conventional case, can be prevented. As a result, the high-quality semiconductor component-mounted component and semiconductor component-mounted finished-product free of the disconnection of the circuit pattern can stably be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed:

1. A semiconductor device-mounted component manufacturing apparatus for performing mounting of a semiconductor device on a circuit pattern, which is electrically connected to the semiconductor device while being brought in contact with a bump of the semiconductor device and is formed of a conductive paste on a pattern forming surface of a base material, the apparatus comprising:
- a semiconductor device pressurizing device for inserting the semiconductor device from one surface of the base material and exposing an end surface of the bump at the other surface of the base material with the bump of the semiconductor device put in an exposed state or an unexposed state proximately to the pattern forming surface; and
- a contact area increasing device for forming a contact area increasing portion for increasing a contact area of the circuit pattern with the bump that is exposed or located proximately to the pattern forming surface,
- wherein the contact area increasing device comprises an extension portion-forming member for forming the contact area increasing portion by coming in contact with the bump or in contact with the pattern forming surface located in the vicinity of the bump.

2. A semiconductor device-mounted finished-product manufacturing apparatus comprising:
- the semiconductor device-mounted component manufacturing apparatus claimed in claim 1; and
- an encapsulating device for encapsulating the semiconductor device mounted component manufactured by the semiconductor device-mounted component manufacturing apparatus.

3. A semiconductor device-mounted component manufacturing apparatus as claimed in claim 1, wherein the extension portion-forming member comprises a hollow portion.

4. A semiconductor device-mounted component manufacturing apparatus as claimed in claim 1, further comprising a heating device coupled to the extension portion-forming member.

5. A semiconductor device-mounted component manufacturing apparatus as claimed in claim 1, wherein the contact area increasing device further comprises:
- an extension portion-forming member pressurizing device for pressuring the extension portion-forming member against the bump or the pattern forming surface located in the vicinity of the bump.

6. A semiconductor device-mounted component manufacturing apparatus as claimed in claim 5, wherein
- the extension portion-forming member has a cylindrical shape and forms a projecting portion that serves as the contact area increasing portion on the bump formed by a pressurizing operation for performing pressurization with the extension portion-forming member pressurizing device.

7. A semiconductor device-mounted component manufacturing apparatus as claimed in claim 5, wherein the extension portion-forming member has at its tip a rugged portion and forms a rugged portion as the contact area increasing portion on the bump formed by a pressurizing operation for performing pressurization with the extension portion forming member pressurizing device.

8. A semiconductor device-mounted component manufacturing apparatus as claimed in claim 5, wherein the extension portion-forming member has a cylindrical shape and forms a contact area increasing groove in the vicinity of the bump by pressurizing the pattern forming surface located in the vicinity of the bump by a pressurizing operation for performing pressurization with the extension portion-forming member pressurizing device, thus exposing the bump from the base material.

9. A semiconductor device-mounted finished-product manufacturing method for encapsulating a semiconductor device-mounted component manufactured by a semiconductor device-mounted component manufacturing method for performing mounting of a semiconductor device on a circuit pattern, which is electrically connected to the semiconductor device while being brought into contact with a bump of the semiconductor device and is formed of a conductive paste on a pattern forming surface of a base material, said semiconductor device-mounted component manufacturing method comprising:
- inserting the semiconductor device into the base material with the bump of the semiconductor device put in an exposed state proximately to the pattern forming surface by inserting the semiconductor device into the base material from one surface of the base material and exposing an end surface of the bump at the opposite surface of the base material; and
- forming a contact area increasing portion for increasing a contact area of the circuit pattern with the bump on the bump exposed on the pattern forming surface,
- wherein said forming the contact area increasing portion comprises having an extension portion-forming member come in contact with the end surface of the bump.

10. A semiconductor device-mounted finished-product manufactured by a semiconductor device-mounted finished-product manufacturing method for encapsulating a semiconductor device-mounted component manufactured by a semiconductor device-mounted component manufacturing method for performing mounting of a semiconductor device on a circuit pattern, which is electrically connected to the semiconductor device while being brought into contact with a bump of the semiconductor device and is formed of a conductive paste on a pattern forming surface of a base material, said semiconductor device-mounted component manufacturing method comprising:
- inserting the semiconductor device into the base material with the bump of the semiconductor device put in an exposed state proximately to the pattern forming surface by inserting the semiconductor device into the base material from one surface of the base material and exposing an end surface of the bump at the opposite surface of the base material; and
- forming a contact area increasing portion for increasing a contact area of the circuit pattern with the bump on the bump exposed on the pattern forming surface,
- wherein said forming the contact area increasing portion comprises having an extension portion-forming member come in contact with the end surface of the bump.

11. A semiconductor device-mounted finished-product as claimed in claim 10, wherein the semiconductor device-mounted finished-product is a noncontact IC card.

* * * * *